US012648138B2

(12) United States Patent
Shimizu et al.

(10) Patent No.: US 12,648,138 B2
(45) Date of Patent: Jun. 2, 2026

(54) SEMICONDUCTOR STORAGE DEVICE INCLUDING A FIRST STACK HAVING AN INSULATION FILM AND A CONDUCTIVE FILM ALTERNATELY STACKED

(71) Applicant: Kioxia Corporation, Tokyo (JP)

(72) Inventors: Shun Shimizu, Yokkaichi (JP); Takashi Ishida, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 903 days.

(21) Appl. No.: 17/549,274

(22) Filed: Dec. 13, 2021

(65) Prior Publication Data

US 2023/0066475 A1 Mar. 2, 2023

(30) Foreign Application Priority Data

Sep. 2, 2021 (JP) ................................. 2021-143394

(51) Int. Cl.
*H10B 43/27* (2023.01)
*H10B 43/10* (2023.01)
*H10W 20/41* (2026.01)

(52) U.S. Cl.
CPC ............. *H10B 43/27* (2023.02); *H10B 43/10* (2023.02); *H10W 20/435* (2026.01)

(58) Field of Classification Search
CPC ........ H10B 43/27; H10B 43/10; H10B 43/40; H01L 23/5283
USPC ....................................................... 257/288
See application file for complete search history.

(56) References Cited

U.S. PATENT DOCUMENTS

| | | | | |
|---|---|---|---|---|
| 9,324,727 B2 * | 4/2016 | Lee | ......................... | H10B 43/27 |
| 10,020,319 B2 | 7/2018 | Baba | | |
| 10,115,730 B1 * | 10/2018 | Baraskar | ................ | H10B 43/27 |
| 10,269,820 B1 * | 4/2019 | Kaminaga | .............. | H10B 41/35 |

(Continued)

FOREIGN PATENT DOCUMENTS

| CN | 107017260 A | 8/2017 |
|---|---|---|
| CN | 113270416 A | 8/2021 |

(Continued)

OTHER PUBLICATIONS

Nemanič, "Hydrogen permeation barriers: Basic requirements, materials selection, deposition methods, and quality evaluation" Nuclear Materials and Energy 19, Apr. 2, 2019, 7 pages.

*Primary Examiner* — Caleb E Henry
*Assistant Examiner* — Pratiksha Jayant Lohakare
(74) *Attorney, Agent, or Firm* — Oblon, McClelland, Maier & Neustadt, L.L.P.

(57) ABSTRACT

A semiconductor storage device includes: a first stack having a first insulation film and a first conductive film alternately stacked in a first direction; a plurality of first column portions respectively including a first semiconductor portion extending in the first stack in the first direction and a charge trapping film provided on an outer circumferential surface of the first semiconductor portion; and a first isolation portion penetrating through an upper-layer portion of the first stack in the first direction, extending in a second direction that crosses the first direction, including a second insulation film and a third insulation film arranged via the second insulation film, and configured to electrically isolate the first conductive film included in the upper-layer portion of the first stack in a third direction that crosses the first and second directions.

22 Claims, 27 Drawing Sheets

(56)　　　　　　　References Cited

U.S. PATENT DOCUMENTS

| | | |
|---|---|---|
| 10,651,190 B2 | 5/2020 | Nagashima |
| 10,854,620 B2 | 12/2020 | Mori et al. |
| 10,978,471 B2 | 4/2021 | Nakatsuka |
| 2014/0004676 A1 | 1/2014 | Eom et al. |
| 2015/0076580 A1* | 3/2015 | Pachamuthu .......... H10B 41/20 |
| | | 257/314 |
| 2015/0348984 A1* | 12/2015 | Yada ...................... H10B 41/35 |
| | | 257/326 |
| 2018/0122822 A1* | 5/2018 | Lee ...................... H10D 62/307 |
| 2018/0138193 A1* | 5/2018 | Zhang ............... H01L 21/76877 |
| 2018/0269224 A1* | 9/2018 | Shimizu ............... H10D 62/292 |
| 2018/0277555 A1* | 9/2018 | Fukushima ......... H01L 23/5329 |
| 2020/0075618 A1* | 3/2020 | Oike ................ H01L 21/76831 |
| 2021/0074592 A1* | 3/2021 | Shioda ................... H10B 43/10 |

FOREIGN PATENT DOCUMENTS

| | | |
|---|---|---|
| JP | 2019-165134 A | 9/2019 |
| JP | 2020-43277 A | 3/2020 |
| JP | 2020-150218 A | 9/2020 |
| TW | 201727636 A | 8/2017 |

* cited by examiner 50   51

12
11a
11(DWL)
11a
12
11a
11(DWL)
11a
12
11a
11(WL)
11a
12

SHE

50

12
11a
11(DWL)
11a
12
11a
11(DWL)
11a
12
11a
11(WL)
11a
12

SHE

Y1

SEMICONDUCTOR STORAGE DEVICE INCLUDING A FIRST STACK HAVING AN INSULATION FILM AND A CONDUCTIVE FILM ALTERNATELY STACKED

CROSS REFERENCE TO RELATED APPLICATIONS

This application is based upon and claims the benefit of priority from the prior Japanese Patent Application No. 2021-143394, filed on Sep. 2, 2021, the entire contents of which are incorporated herein by reference.

FIELD

The embodiments of the present invention relate to a semiconductor storage device and manufacturing method thereof.

BACKGROUND

A semiconductor storage device such as a NAND flash memory may include a three-dimensional memory cell array having a plurality of memory cells arranged three-dimensionally. A plurality of selection gates are provided in an upper portion of the three-dimensional memory cell array in order to select a memory string. In this semiconductor storage device, an isolation portion is provided above the three-dimensional memory cell array in order to electrically isolate mutually adjacent selection gates from each other.

In a case of forming the isolation portion after formation of word lines of the memory cell array, impurities such as hydrogen may enter the word lines through the isolation portion. The impurities having entered the word lines may cause deterioration of data retention characteristics of the word lines.

DETAILED DESCRIPTION

Figure 1A:
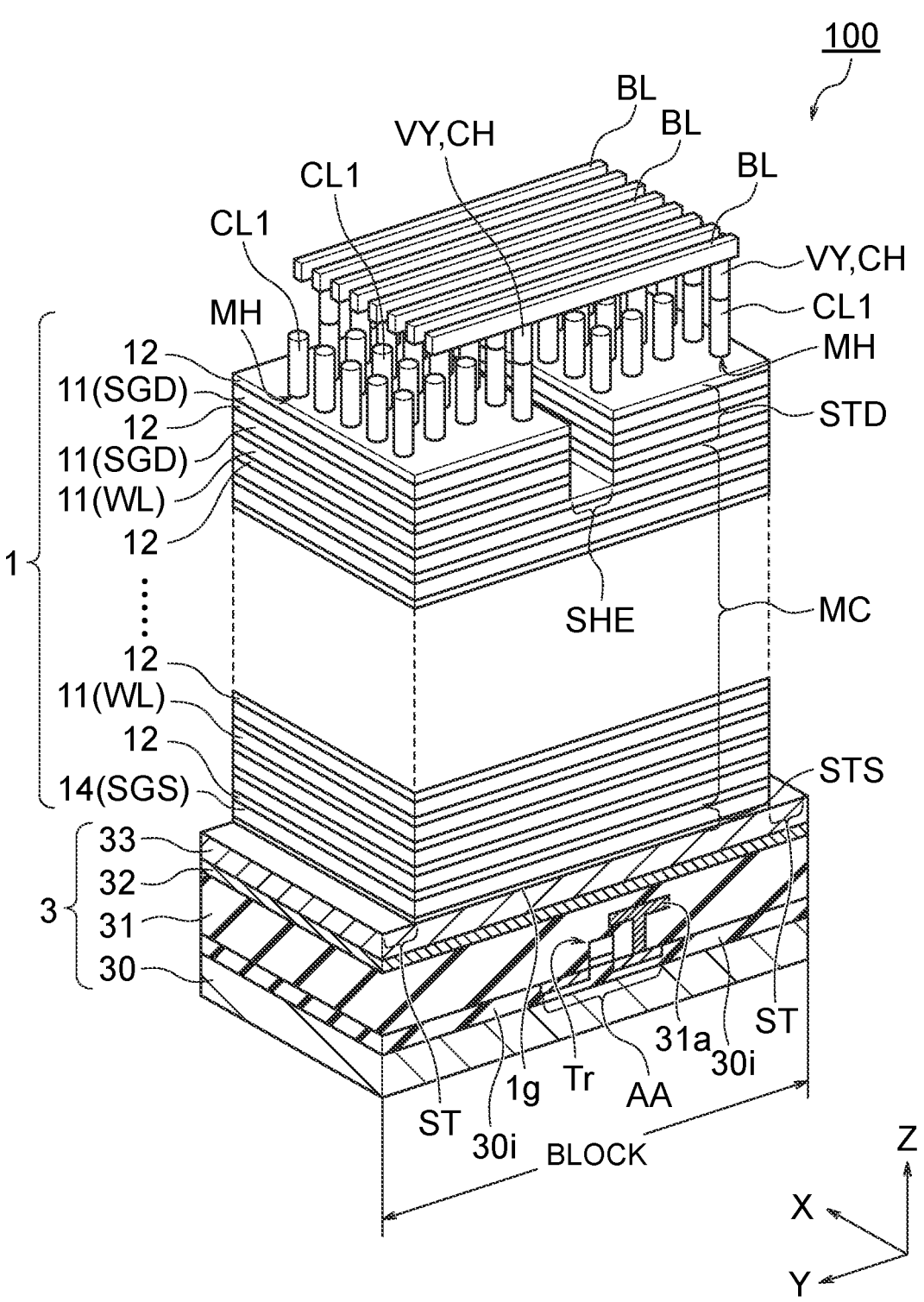
FIG. 1A is a schematic perspective view illustrating an example of a semiconductor storage device according to a first embodiment.

Embodiments will now be explained with reference to the accompanying drawings. The present invention is not limited to the embodiments. In the present specification and the drawings, elements identical to those described in the foregoing drawings are denoted by like reference characters and detailed explanations thereof are omitted as appropriate.

A semiconductor storage device according to the present embodiment includes a first stack having a first insulation film and a first conductive film alternately stacked in a first direction. A plurality of first column portions each include a first semiconductor portion extending in the first stack in the first direction and a charge trapping film provided on an outer circumferential surface of the first semiconductor portion. A first isolation portion penetrates through an upper-layer portion of the first stack in the first direction, extends in a second direction that crosses the first direction, includes a second insulation film and a third insulation film arranged via the second insulation film, and are configured to electrically isolate the first conductive film included in the upper-layer portion of the first stack in a third direction that crosses the first and second directions.

First Embodiment

Figure 1B:
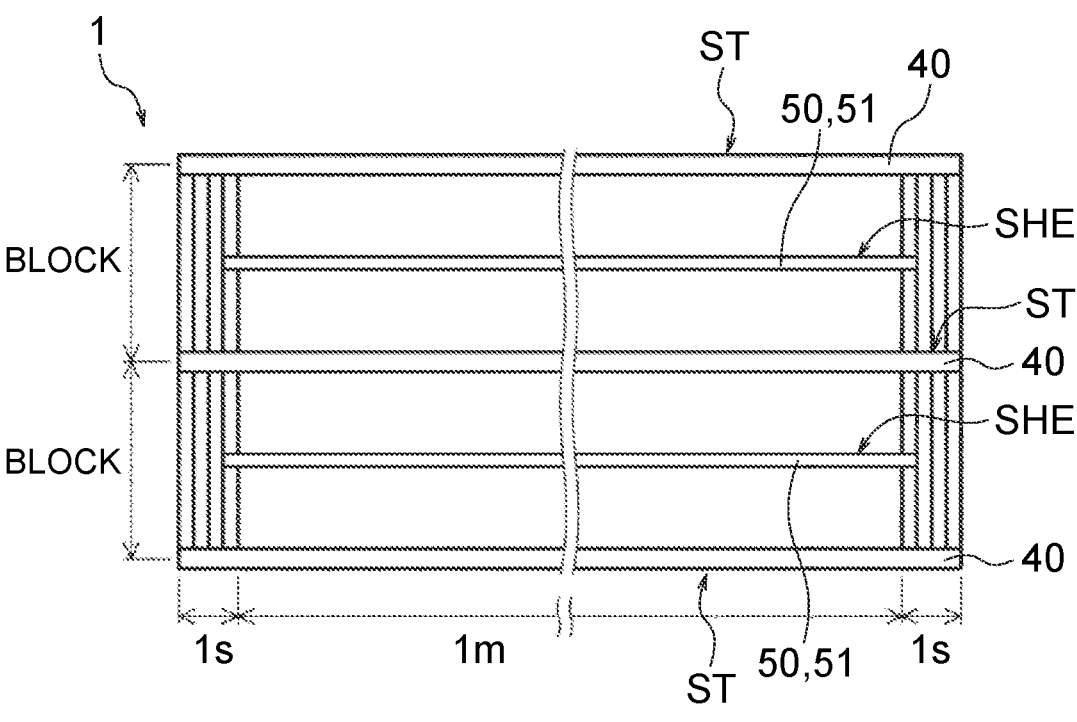
FIG. 1B is a schematic plan view illustrating a stack.
Figure 1C:
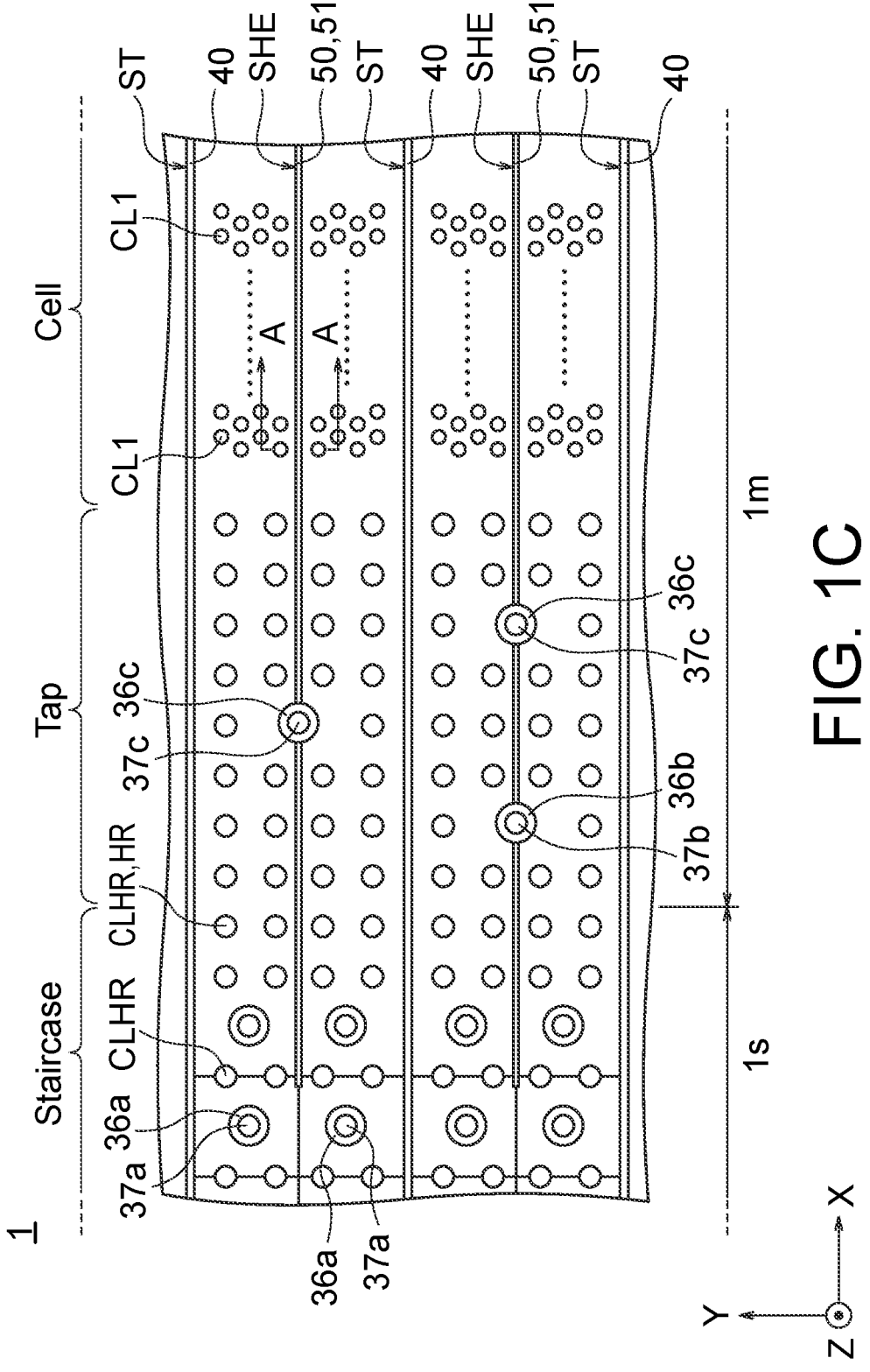
FIG. 1C is a schematic plan view illustrating the semiconductor storage device.
Figure 2A:
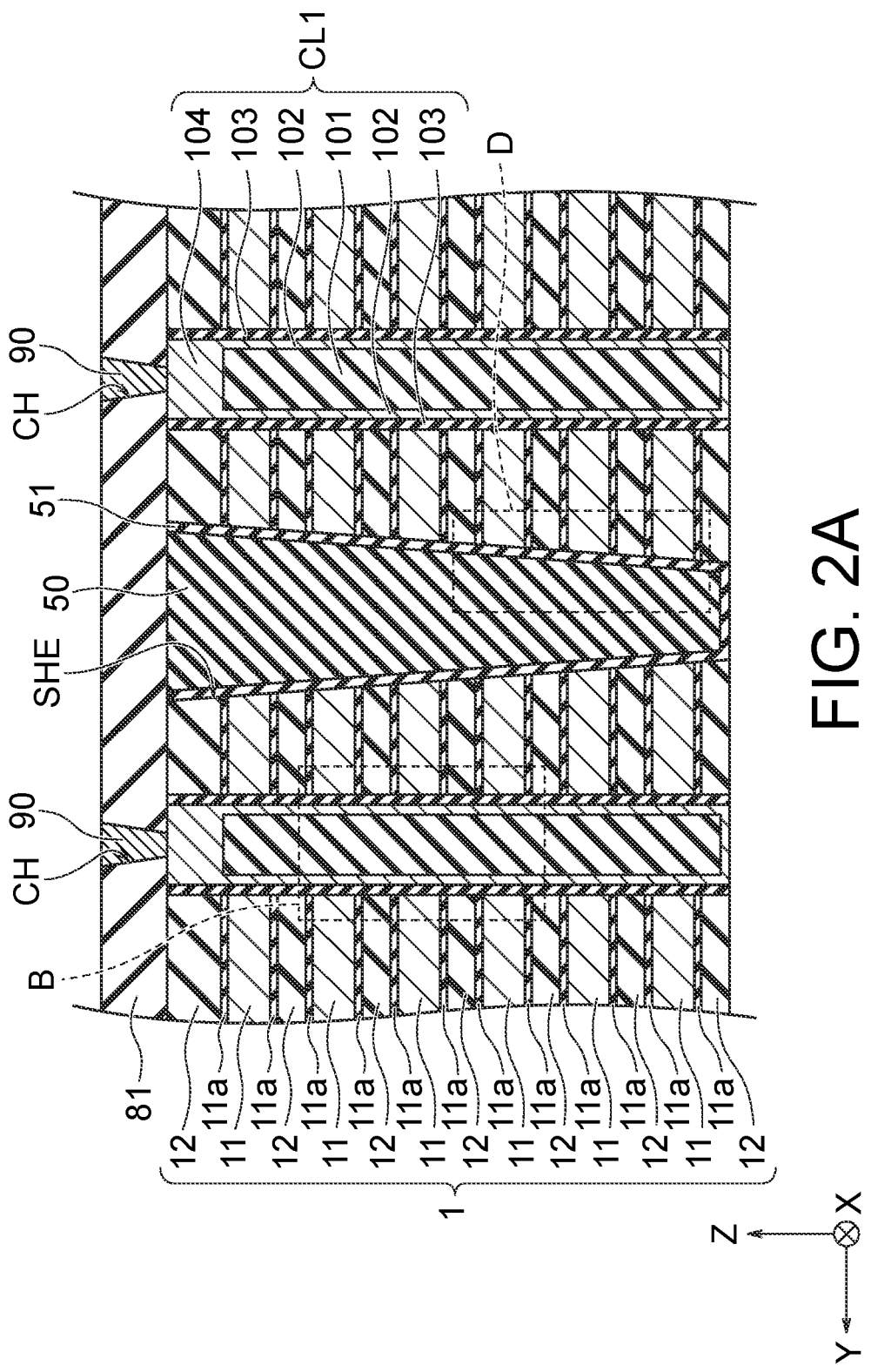
FIG. 2A is a schematic cross-sectional view of the semiconductor storage device.
Figure 2B:
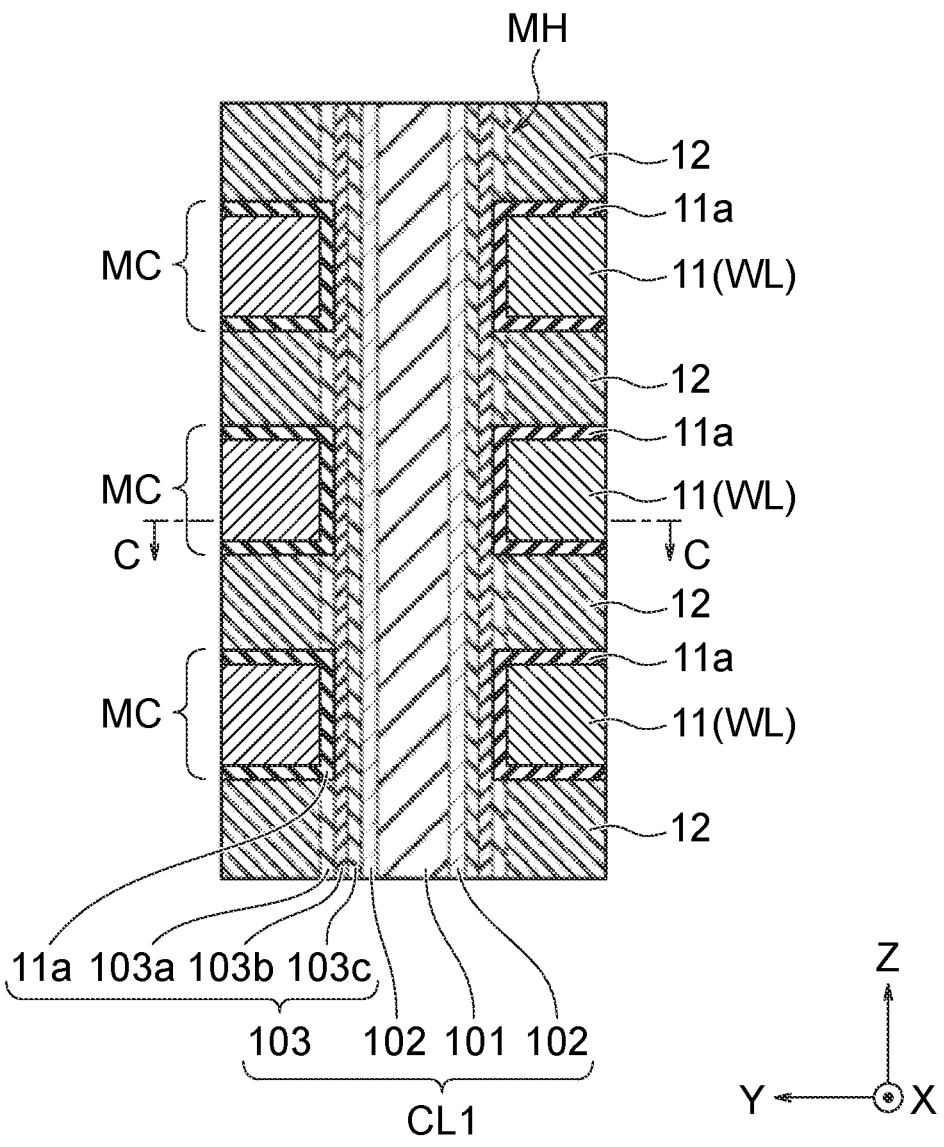
FIGS. 2B and 2C are schematic cross-sectional views of an example of a memory cell having a three-dimensional configuration.
Figure 2C:
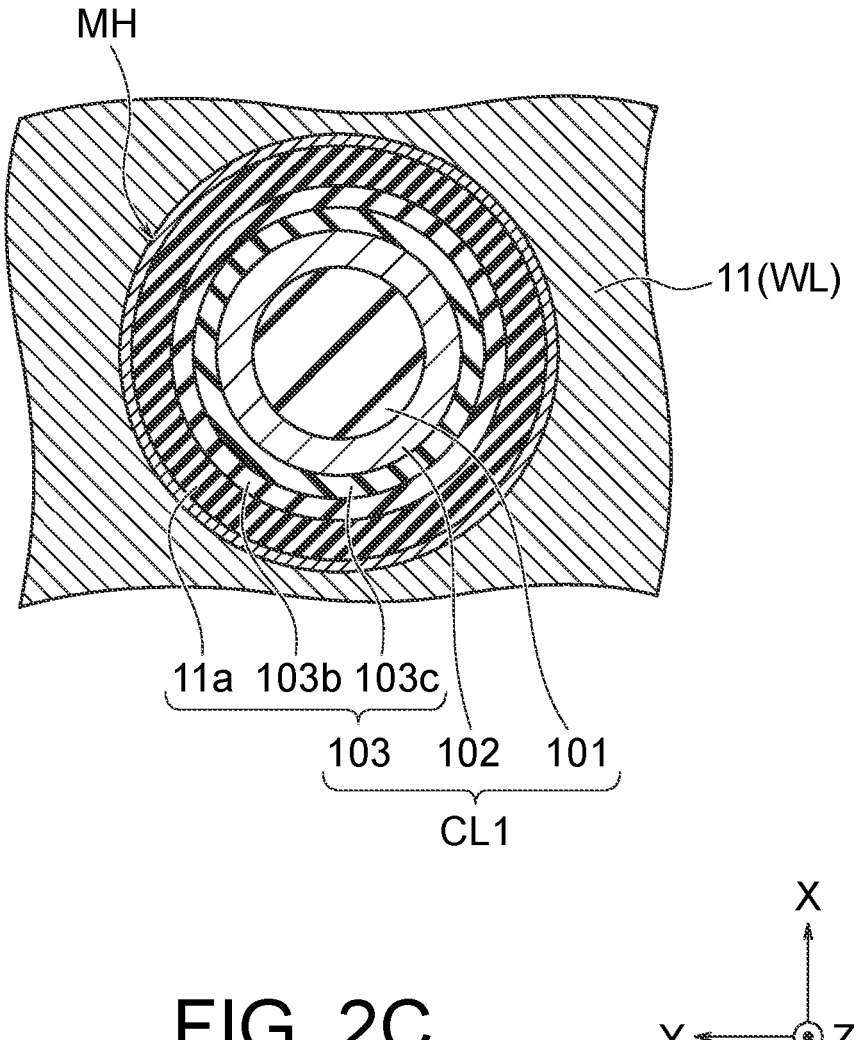

FIG. 1A is a schematic perspective view illustrating an example of a semiconductor storage device 100 according to a first embodiment. FIG. 1B is a schematic plan view illustrating a stack 1. FIG. 1C is a schematic plan view illustrating the semiconductor storage device 100. In the present specification, a stacking direction of the stack 1 is assumed as a first direction (the Z-direction). One direction that crosses the first direction, for example, at right angles is assumed as a second direction (the X-direction). One direction that crosses the first and second directions, for example, at right angles is assumed as a third direction (the Y-direction). A plane that crosses the Z-direction is an X-Y plane. FIG. 2A is a schematic cross-sectional view of the semiconductor storage device 100. FIGS. 2B and 2C are schematic cross-sectional views of an example of a memory cell having a three-dimensional configuration.

As illustrated in FIGS. 1A to 2C, the semiconductor storage device 100 according to the first embodiment is a non-volatile memory including the memory cells having a three-dimensional configuration.

The semiconductor storage device 100 includes a base portion 3, the stack 1, a deep slit ST (a plate-shaped portion 40), a shallow slit SHE (isolation portions 50 and 51), and a plurality of column portions CL1.

The base portion 3 includes a substrate 30, an insulation film 31, a conductive film 32, and a semiconductor portion 33. The insulation film 31 is provided on the substrate 30. The conductive film 32 is provided on the insulation film 31. The semiconductor portion 33 is provided on the conductive film 32. The substrate 30 is, for example, a silicon substrate. The conductivity type of silicon (Si) is, for example, a p-type. For example, an element isolation region 30$i$ is provided in a surface region of the substrate 30. The element isolation region 30$i$ is an insulating region containing, for example, silicon oxide and defines an active area AA in the surface region of the substrate 30. A source region and a drain region of a transistor Tr are provided in the active area AA. The transistor Tr configures a peripheral circuit (a CMOS (Complementary Metal Oxide Semiconductor) circuit) of the non-volatile memory. The insulation film 31 contains, for example, silicon oxide (SiO$_2$) and insulates the transistor Tr. A wire 31$a$ is provided in the insulation film 31. The wire 31$a$ is a wire electrically connected to the transistor Tr. The conductive film 32 contains conductive metal, for example, tungsten (W). The semiconductor portion 33 contains, for example, silicon. The conductivity type of silicon is, for example, an n-type. A portion of the semiconductor portion 33 may contain undoped silicon.

The stack 1 is provided above the substrate 30 and is located in the Z-direction with respect to the semiconductor portion 33. The stack 1 is an example of a first stack. The stack 1 is configured by a plurality of conductive films 11 and a plurality of insulation films 12 alternately stacked along the Z-direction. The conductive film 11 is an example of a first conductive film, and the insulation film 12 is an example of a first insulation film. The conductive film 11 contains conductive metal, for example, tungsten or titanium nitride (TiN). The insulation film 12 contains, for example, silicon oxide. The insulation film 12 insulates the conductive films 11 from each other. Each of the number of the stacked conductive films 11 and the number of the stacked insulation films 12 may be any number. The insulation film 12 may be, for example, an air gap. An insulation film 1$g$, for example, is provided between the stack 1 and the semiconductor portion 33. The insulation film 1$g$ contains, for example, silicon oxide (SiO$_2$). The insulation film 1$g$ may contain a high dielectric material having a higher relative permittivity than silicon oxide. The high dielectric material may be, for example, a metal oxide such as hafnium oxide.

The conductive films 11 include at least one source-side selection gate SGS, a plurality of word lines WL, and at least one drain-side selection gate SGD. The source-side selection gate SGS is a gate electrode of a source-side selection transistor STS. The drain-side selection gate SGD is a gate electrode of a drain-side selection transistor STD. The source-side selection gate SGS is provided in a lower region of the stack 1. The drain-side selection gate SGD is provided in an upper region of the stack 1. The lower region is a region of the stack 1 closer to the base portion 3, and the upper region is a region of the stack 1 farther from the base portion 3. The word lines WL are provided between the source-side selection gate SGS and the drain-side selection gate SGD.

Among the insulation films 12, the thickness in the Z-direction of the insulation film 12 that insulates the source-side selection gate SGS and the word line WL from each other may be larger than the thickness in the Z-direction of the insulation film 12 that insulates the word lines WL from each other, for example.

The semiconductor storage device 100 includes a plurality of memory cells MC connected in series between the source-side selection gate SGS and the drain-side selection gate SGD. The configuration in which the source-side selection transistor STS, the memory cells MC, and the drain-side selection transistor STD are connected in series is called "memory string" or "NAND string". The memory strings are connected to bit lines BL, for example, via contact holes CH and VY. The bit lines BL are provided above the stack 1 and extend in the Y-direction.

The deep slits ST and the shallow slits SHE are respectively provided in the stack 1. The deep slits ST are provided to penetrate through the stack 1 from the top end of the stack 1 to the base portion 3 in the Z-direction and to extend in the X-direction in the stack 1 in plan view as viewed from the Z-direction. The plate-shaped portion 40 is provided in the deep slit ST (FIG. 1B). An insulator, for example, silicon oxide is used for the plate-shaped portion 40. The plate-shaped portion 40 may be electrically insulated from the stack 1 by an insulation film and also contain a conductive film electrically connected to the semiconductor portion 33. The shallow slits SHE are provided to extend in the Z-direction from the top end of the stack 1 to the middle in an upper-layer portion of the stack 1. The shallow slits SHE extend in the X-direction in plan view as viewed from the Z-direction. The insulation films 50 and 51 are provided in the shallow slit SHE. The configuration of the shallow slit SHE will be described in detail later. The deep slits ST and the shallow slits SHE extend in the X-direction substantially in parallel to each other in a plane crossing the Z-direction (an X-Y plane), that is, in plan view as viewed from the Z-direction.

As illustrated in FIG. 1B, the stack 1 includes a staircase portion 1$s$ and a memory cell array portion inn. The staircase portion 1$s$ is provided at an edge of the stack 1. The memory cell array portion 1$m$ is sandwiched between or surrounded by the staircase portions 1$s$. The deep slit ST is provided from the staircase portion 1$s$ at one end of the stack 1 to the staircase portion 1$s$ at the other end of the stack 1 through the memory cell array portion 1$m$. The shallow slit SHE is provided at least in the memory cell array portion 1$m$.

As illustrated in FIG. 1C, the memory cell array portion 1$m$ includes a cell region (Cell) and a tap region (Tap). The staircase portion 1$s$ includes a staircase region (Staircase). The tap region is provided, for example, between the cell region and the staircase region. The tap region may be provided, for example, between the cell regions, although not illustrated in FIG. 1C. The staircase region is a region where a plurality of wires 37$a$ are provided. The tap region is a region where wires 37$b$ and 37$c$ are provided. The wires 37$a$ to 37$c$ each extend in the Z-direction, for example. Each wire 37$a$ is electrically connected to the conductive film 11, for example. The wire 37$b$ is electrically connected to the conductive film 32, for example. The wire 37$c$ is electrically connected to the wire 31$a$, for example.

A portion of the stack 1 which is sandwiched between the two plate-shaped portions 40 illustrated in FIG. 1B is called a block (BLOCK). The block is, for example, the minimum unit for erasing data. The insulation film 50 is provided in the block. The stack 1 between the plate-shaped portion 40 and the insulation film 50 is called a finger. The drain-side selection gate SGD is divided for each finger. It is therefore possible to place one finger in a block in a selected state by the drain-side selection gate SGD in data writing and data reading.

As illustrated in FIG. 1A, each column portion CL1 is provided in a memory hole MH provided in the stack 1. The column portion CL1 is an example of a first column portion. Each column portion CL1 penetrates through the stack 1 from the top end of the stack 1 along the Z-direction and is provided in the stack 1 and the semiconductor portion 33.

FIG. 2A is a cross-sectional view along a line A-A in FIG. 1C, illustrating a cross-section of the semiconductor storage device 100 as viewed from the X-direction. As illustrated in FIG. 2A, the semiconductor storage device 100 includes the stack 1 in which the conductive film 11 and the insulation film 12 are alternately stacked in the Z-direction and the column portions CL1 extending in the stack 1 in the Z-direction. A block film 11a is provided between the conductive film 11 and the insulation film 12. The conductive film 11 is an example of the first conductive film, the insulation film 12 is an example of the first insulation film, the column portion CL1 is an example of the first column portion, and the block film 11a is an example of a first protection film. The column portion CL1 includes a core layer 101 extending in the Z-direction in the stack 1, a semiconductor body 102 provided on the outer circumferential surface of the core layer 101, a charge trapping film 103 provided on the outer circumferential surface of the semiconductor body 102, and a cap layer 104 provided on the core layer 101. The semiconductor body 102 is an example of a first semiconductor portion. The semiconductor body 102 is electrically connected to the semiconductor portion 33. The column portions CL1 selected from the respective fingers are connected to one bit line BL in common via the contact hole CH, VY. The contact hole CH, VY is filled with conductive metal, for example, tungsten (W) or titanium nitride (TiN) to form a contact plug 90. That is, the contact hole CH, VY and the cap layer 104 are electrically connected to each other, whereby the semiconductor body 102 and the bit line BL are electrically connected to each other. The contact hole CH, VY is electrically isolated by an interlayer dielectric film 81. The interlayer dielectric film 81 contains, for example, silicon oxide. Each column portion CL1 is provided in the cell region (Cell), for example (FIG. 1C).

Next, the column portion CL1 is described with reference to FIGS. 2B and 2C. FIG. 2B is an enlarged view of a region B in FIG. 2A, and FIG. 2C is a cross-sectional view along a line C-C in FIG. 2B. The shape of the memory hole MH in an X-Y plane is, for example, circular or elliptical, as illustrated in FIGS. 2B and 2C. The block film 11a may form a portion of the charge trapping film 103 between the conductive film 11 and the semiconductor body 102. The block film 11a is made of, for example, a metal oxide or silicon oxide. One example of the metal oxide is aluminum oxide ($Al_2O_3$). The block film 11a suppresses back tunneling of electric charges from the conductive film 11 toward the charge trapping film 103.

The shape of the semiconductor body 102 is, for example, a tube with a bottom. The semiconductor body 102 contains, for example, silicon. Silicon contained here is, for example, polysilicon obtained by crystallizing amorphous silicon. The semiconductor body 102 is made of, for example, undoped silicon. The semiconductor body 102 may be made of, for example, p-type silicon. The semiconductor body 102 serves as a channel of each of the drain-side selection transistor STD, the memory cell MC, and the source-side selection transistor STS.

The charge trapping film 103 is provided between the inner wall of the memory hole MH other than the block film 11a and the semiconductor body 102. The shape of the charge trapping film 103 is, for example, tubular. The memory cells MC each include a storage region between the semiconductor body 102 and the conductive film 11 serving as the word line WL and are stacked in the Z-direction. The charge trapping film 103 includes, for example, a cover insulation film 103a, a charge trapping portion 103b, and a tunnel insulation film 103c. The semiconductor body 102, the charge trapping portion 103b, and the tunnel insulation film 103c each extend in the Z-direction. From the above description, each column portion CL1 includes the semiconductor body 102 extending in the Z-direction in the stack 1 and the charge trapping film 103 provided on the outer circumferential surface of the semiconductor body 102.

The cover insulation film 103a is provided between the insulation film 12 and the charge trapping portion 103b. The cover insulation film 103a contains, for example, silicon oxide. The cover insulation film 103a protects the charge trapping portion 103b from being etched when a sacrifice film (not illustrated) is replaced with the conductive film 11 (that is, in a replacing process). The cover insulation film 103a may be removed from between the conductive film 11 and the charge trapping film 103 in the replacing process. In this case, the block film 11a, for example, is provided between the conductive film 11 and the charge trapping film 103 as illustrated in FIGS. 2B and 2C.

The charge trapping portion 103b is provided between the block film 11a and the cover insulation film 103a, and the tunnel insulation film 103c. The charge trapping portion 103b contains, for example, a silicon nitride film (SiN) and has trap sites that trap electric charges therein. A portion of the charge trapping portion 103b, sandwiched between the conductive film 11 serving as the word line WL and the semiconductor body 102, traps electric charges and forms a storage region of the memory cell MC. A threshold voltage of the memory cell MC is varied depending on whether electric charges are present in the charge trapping portion 103b or in accordance with the amount of electric charges trapped in the charge trapping portion 103b. In this manner, the memory cell MC retains information.

The tunnel insulation film 103c is provided between the semiconductor body 102 and the charge trapping portion 103b. The tunnel insulation film 103c contains, for example, silicon oxide, or silicon oxide and silicon nitride. The tunnel insulation film 103c is a potential barrier between the semiconductor body 102 and the charge trapping portion 103b. For example, when electrons are injected from the semiconductor body 102 to the charge trapping portion 103b (a write operation) and when holes are injected from the semiconductor body 102 to the charge trapping portion 103b (an erase operation), the electrons and the holes each pass (tunnel) through the potential barrier by the tunnel insulation film 103c.

The core layer 101 is embedded in the space within the tubular semiconductor body 102. The shape of the core layer 101 is, for example, columnar. The core layer 101 contains, for example, silicon oxide and has insulation properties.

Each of column portions CLHR (FIG. 1C) is provided in a hole HR provided in the stack 1. The hole HR penetrates through the stack 1 from the top end of the stack 1 along the Z-direction and is provided in the stack 1 and in the semiconductor portion 33. The column portion CLHR contains silicon oxide. Each column portion CLHR may have the same configuration as the column portion CL1. The column portions CLHR are provided, for example, in the staircase region and the tap region. The column portions CLHR serve as support members for maintaining gaps formed in the staircase region and the tap region in the replacing process. The semiconductor storage device 100 further includes a semiconductor portion 14. The semiconductor portion 14 is located between the stack 1 and the semiconductor portion 13. The conductivity type of the semiconductor portion 14 is, for example, an n-type and may serve as a source-side selection gate (FIG. 1A).

Referring back to FIG. 2A, the semiconductor storage device 100 is provided with the shallow slit SHE that penetrates through an upper-layer portion of the stack 1 in the Z-direction. The barrier film 51 and the insulation film 50 are included in the shallow slit SHE. The barrier film 51 covers the inner wall of the shallow slit SHE, and the shallow slit SHE is filled with the insulation film 50 via the barrier film 51. The barrier film 51 covers the upper-layer portion of the stack 1 in the shallow slit SHE. The barrier film 51 isolates the upper-layer portion of the stack 1 and the insulation film 50 from each other. The barrier film 51 is an example of a second insulation film, and the insulation film 50 is an example of a third insulation film. The barrier film 51 and the insulation film 50 are provided in the shallow slit SHE as isolation portions and therefore are also described as the isolation portions 50 and 51 below. The isolation portions 50 and 51 in the shallow slit SHE electrically isolate the conductive film 11 in the upper-layer portion of the stack 1. That is, the isolation portions 50 and 51 are provided to electrically isolate the mutually adjacent drain-side selection gates SGD from each other. The isolation portions 50 and 51 as a first isolation portion penetrate through the upper-layer portion of the stack 1 in the Z-direction and extend in the X-direction. That is, the first isolation portion includes the barrier film 51 and the insulation film 50 arranged via the barrier film 51 and electrically isolates the conductive film 11 included in the upper-layer portion of the stack 1 in the Y-direction.

A function of the barrier film 51 is described with reference to FIGS. 2D and 2E.

Figures 2D, 2E:
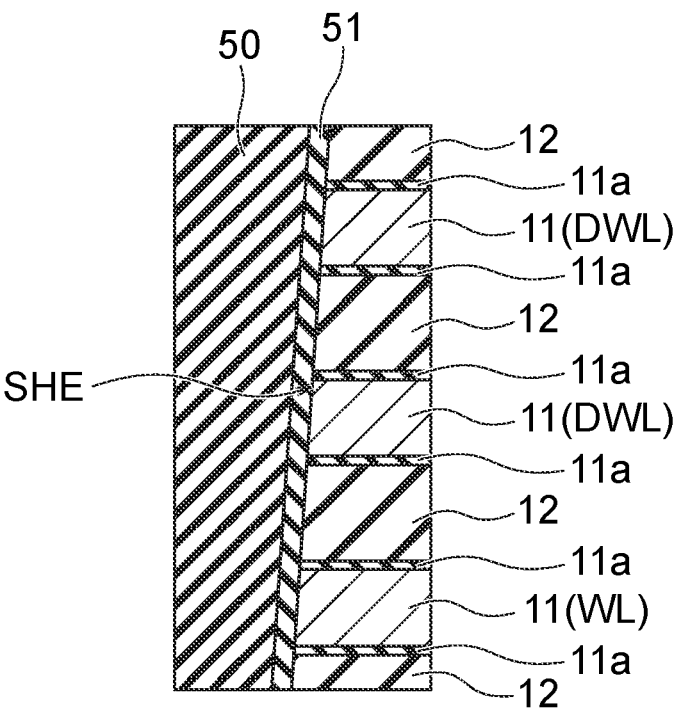
FIG. 2D is an enlarged cross-sectional view of a region D in FIG. 2A.
FIG. 2E is a cross-sectional view illustrating a comparative example in which the barrier film is not provided.

FIG. 2D is an enlarged cross-sectional view of a region D in FIG. 2A. FIG. 2E is a cross-sectional view illustrating a comparative example in which the barrier film 51 is not provided.

As illustrated in FIG. 2D, the shallow slit SHE penetrates through the upper-layer portion of the stack 1 in the Z-direction. The shallow slit SHE penetrates through the conductive film 11 serving as the drain-side selection gate SGD and the conductive film 11 directly below the drain-side selection gate SGD. The conductive film 11 directly below the drain-side selection gate SGD is a dummy word line DWL. No data is stored in memory cells (dummy cells) of the dummy word line DWL. The shallow slit SHE also penetrates through the conductive film 11 below the dummy word line DWL in some cases. In those cases, the word line WL through which the shallow slit SHE penetrates becomes the dummy word line DWL consequently.

As illustrated in FIG. 2D, the isolation portions 50 and 51 are formed by covering the inner wall of the shallow slit SHE with barrier film 51 and further filling the shallow slit SHE with the insulation film 50. The barrier film 51 is provided between the conductive film 11 and the insulation film 50. The block film 11*a* is not provided between the conductive film 11 and the barrier film 51, and the conductive film 11 is in direct contact with the barrier film 51.

An insulating material having a larger PRF (Permeation Reduction Factor) value than a silicon oxide film (SiO$_2$) is used for the barrier film 51. The PRF value is a value for evaluating the property of suppressing entrance of hydrogen. Examples of the insulating material having a larger PRF value than a silicon oxide film include a silicon nitride film (SiN), aluminum oxide (Al$_2$O$_3$), aluminum nitride (AlN), and zirconium oxide (ZrO$_2$). Therefore, it suffices to use, for example, a silicon nitride film (SiN), aluminum oxide (Al$_2$O$_3$), aluminum nitride (AlN), or zirconium oxide (ZrO$_2$) for the barrier film 51. The thickness of the barrier film 51 is, for example, 3 to 10 nm and covers the inside of the shallow slit SHE with a uniform thickness. Meanwhile, it suffices that the insulation film 50 is made of an insulating material having a smaller PRF value, for example, a silicon oxide film.

As described above, the barrier film 51 is present between the conductive film 11 and the insulation film 50 and between the block film 11*a* and the insulation film 50. Therefore, entrance of impurities such as hydrogen from the insulation film 50 to the conductive films 11 and the block film 11*a* is suppressed by the barrier film 51.

Meanwhile, in the comparative example illustrated in FIG. 2E, the barrier film 51 is not present between the conductive film 11 and the insulation film 50 and between the block film 11*a* and the insulation film 50. Therefore, impurities such as hydrogen enter the conductive film 11 and the block film 11*a* from the insulation film 50, as illustrated with an arrow Y1, for example. Impurities such as hydrogen having entered the conductive film 11 (the word line WL) and the block film 11*a* deteriorate data retention characteristics of the memory cells MC. The data retention is a time until data stored in a memory cell MC is lost.

According to the present embodiment, the barrier film 51 suppresses entrance of impurities such as hydrogen to the conductive film 11 (the word line WL) and the block film 11*a* in the manner described above. Accordingly, it is possible to suppress deterioration of data retention characteristics of the semiconductor storage device 100.

Next, a manufacturing method of the semiconductor storage device 100 is described.

FIGS. 3A to 12 are schematic diagrams illustrating an example of a manufacturing method of the semiconductor storage device 100 according to the first embodiment. FIGS. 3A to 12 are cross-sectional views of a portion taken along the line A-A in FIG. 1C.

Figure 3A:
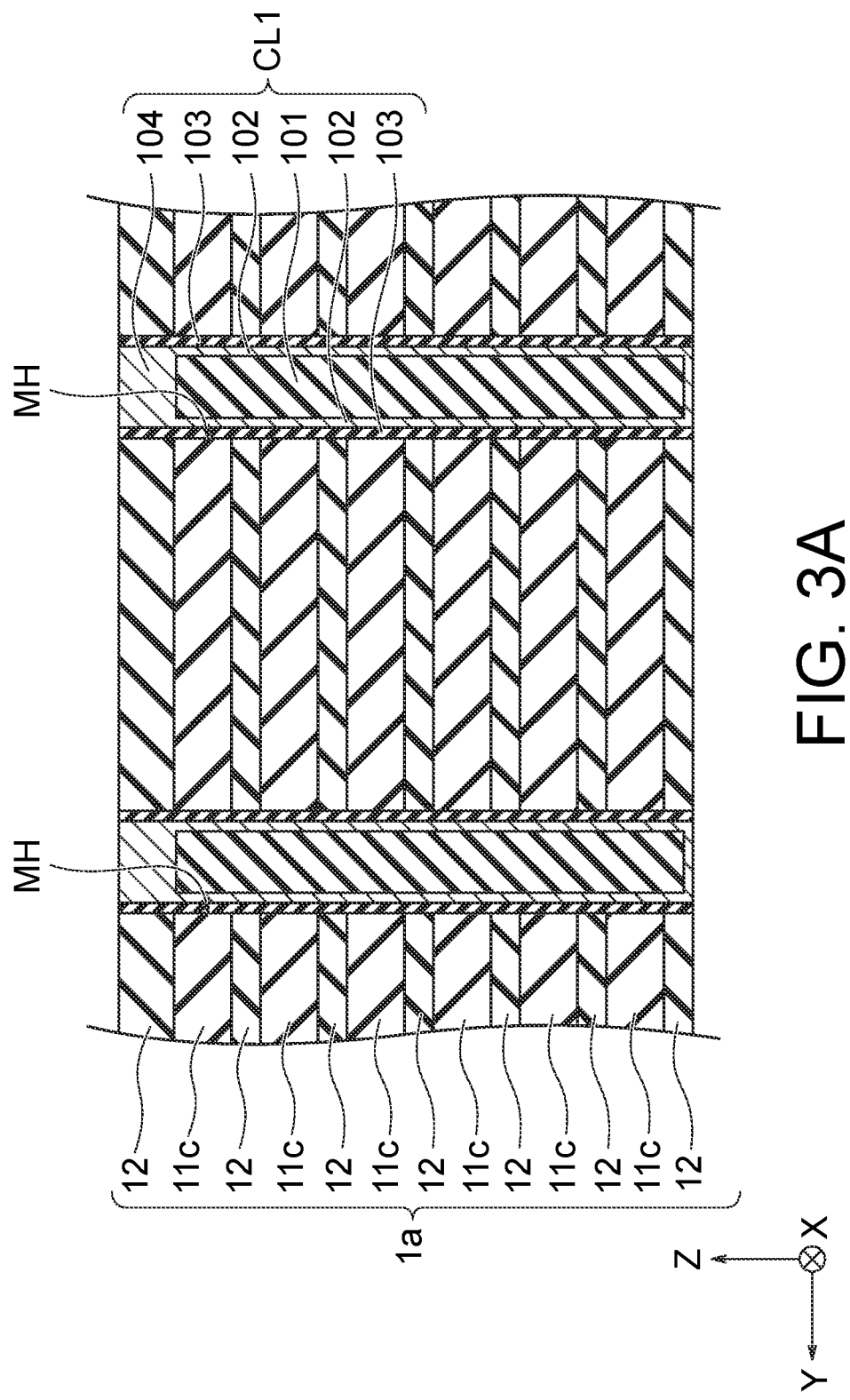
FIGS. 3A to 12 are schematic diagrams illustrating an example of a manufacturing method of the semiconductor storage device according to the first embodiment.

First, the insulation film 12 and a sacrifice film 11*c* are alternately stacked in the Z-direction to form a stack 1*a* on the base portion 3 in FIG. 1A, as illustrated in FIG. 3A. The sacrifice film 11*c* is an example of a first sacrifice film. A silicon oxide film, for example, is used as the insulation film 12 and a silicon nitride film, for example, is used as the sacrifice film 11*c*.

Next, the memory holes MH are formed in the stack 1*a* by lithography and etching, for example. The charge trapping film 103 and the semiconductor body 102 are then formed on the inner wall surface of the memory holes MH in that order, and the core layer 101 is embedded inside the semiconductor body 102. Further, the cap layer 104 is formed on the core layer 101. In this manner, the column portions CL1 are formed in the memory holes MH, each of which includes the core layer 101, the semiconductor body 102 provided on the outer circumferential surface of the core layer 101, the charge trapping film 103 provided on the outer circumferential surface of the semiconductor body 102, and the cap layer 104 provided on the core layer 101.

Next, the deep slit ST described with reference to FIGS. 1A to 1C is formed to penetrate through the stack 1*a*.

Figure 3B:
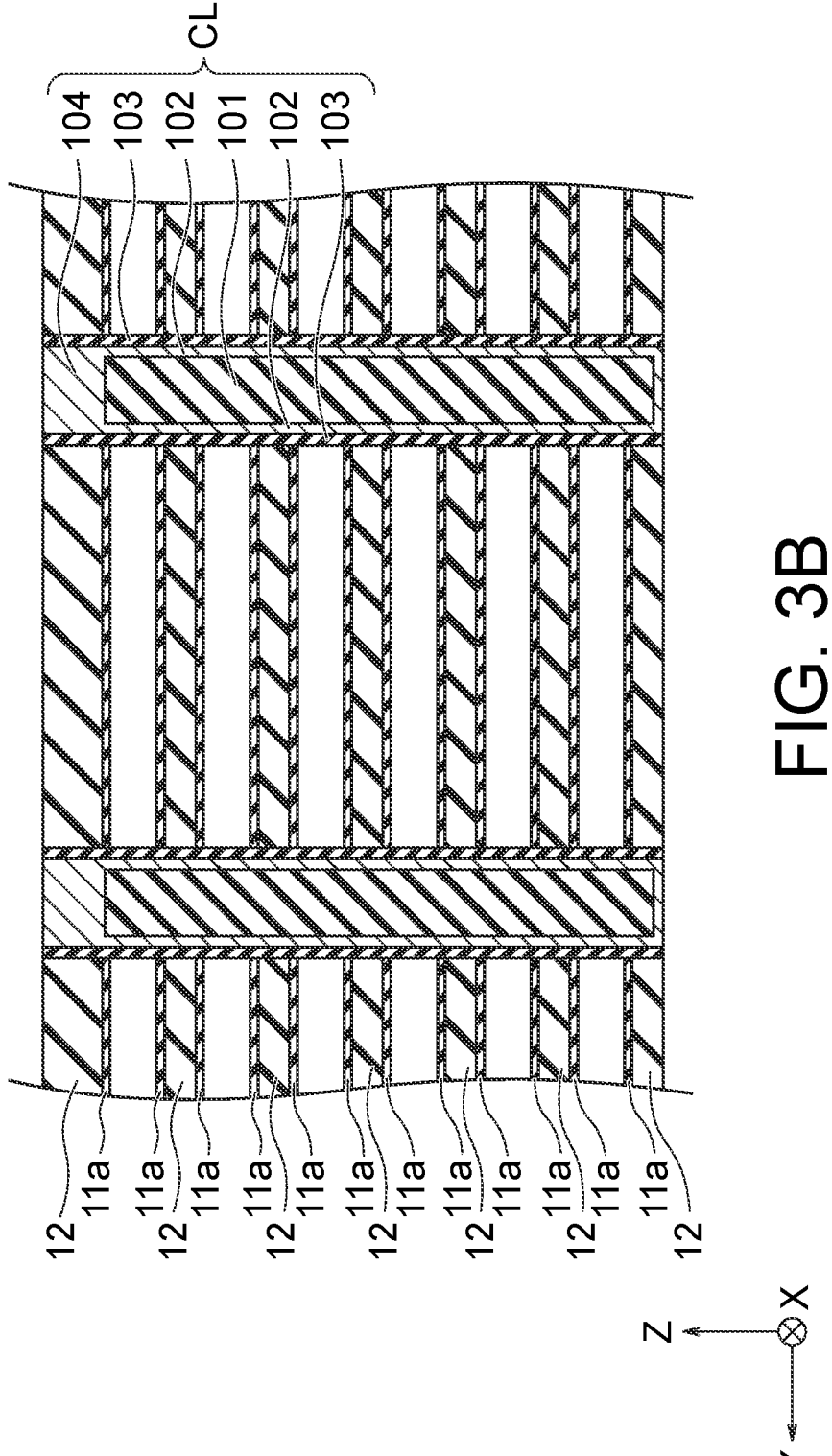

Next, the sacrifice films 11*c* are removed via the deep slits ST by phosphoric acid solution or the like, as illustrated in FIG. 3B. The block film 11*a* is then formed on the inner wall of a space between the insulation films 12 adjacent to each other in the Z-direction.

Figure 3C:
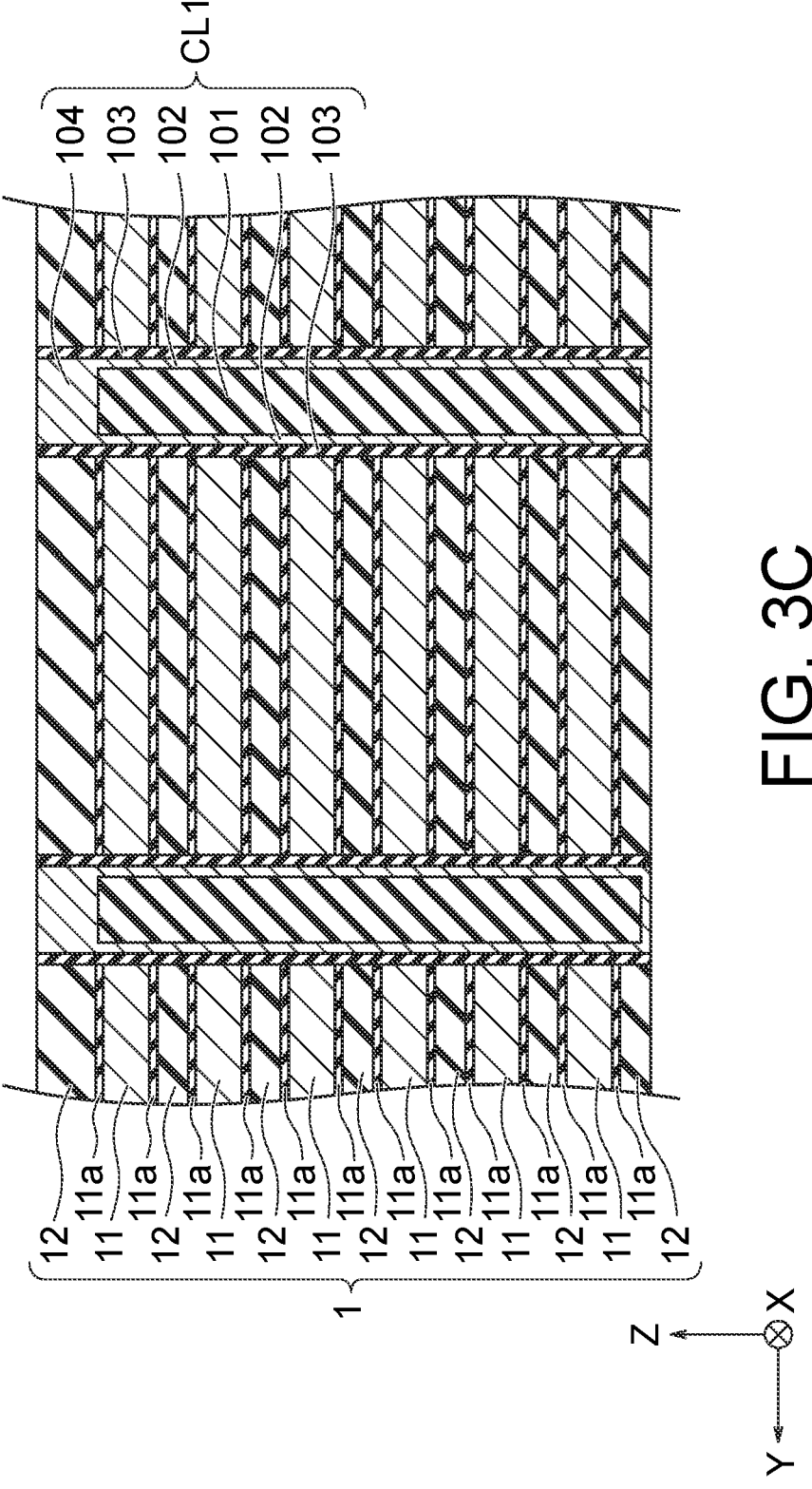

Next, conductive metal, for example, tungsten (W) or titanium nitride (TiN) is embedded in the space between the insulation films 12 adjacent to each other in the Z-direction, as illustrated in FIG. 3C. In this manner, the conductive film 11 is embedded in the space between the insulation films 12 adjacent to each other in the Z-direction. The block film 11*a* is provided between the conductive film 11 and the insulation film 12. This process of replacing the sacrifice film 11c with the conductive film 11 is called a replacing process. The column portions CL1 may be formed after the replacing process described with reference to FIGS. 3A to 3C. In this case, the memory hole MH is filled with a sacrifice film (not illustrated) before the replacing process.

Figure 4:
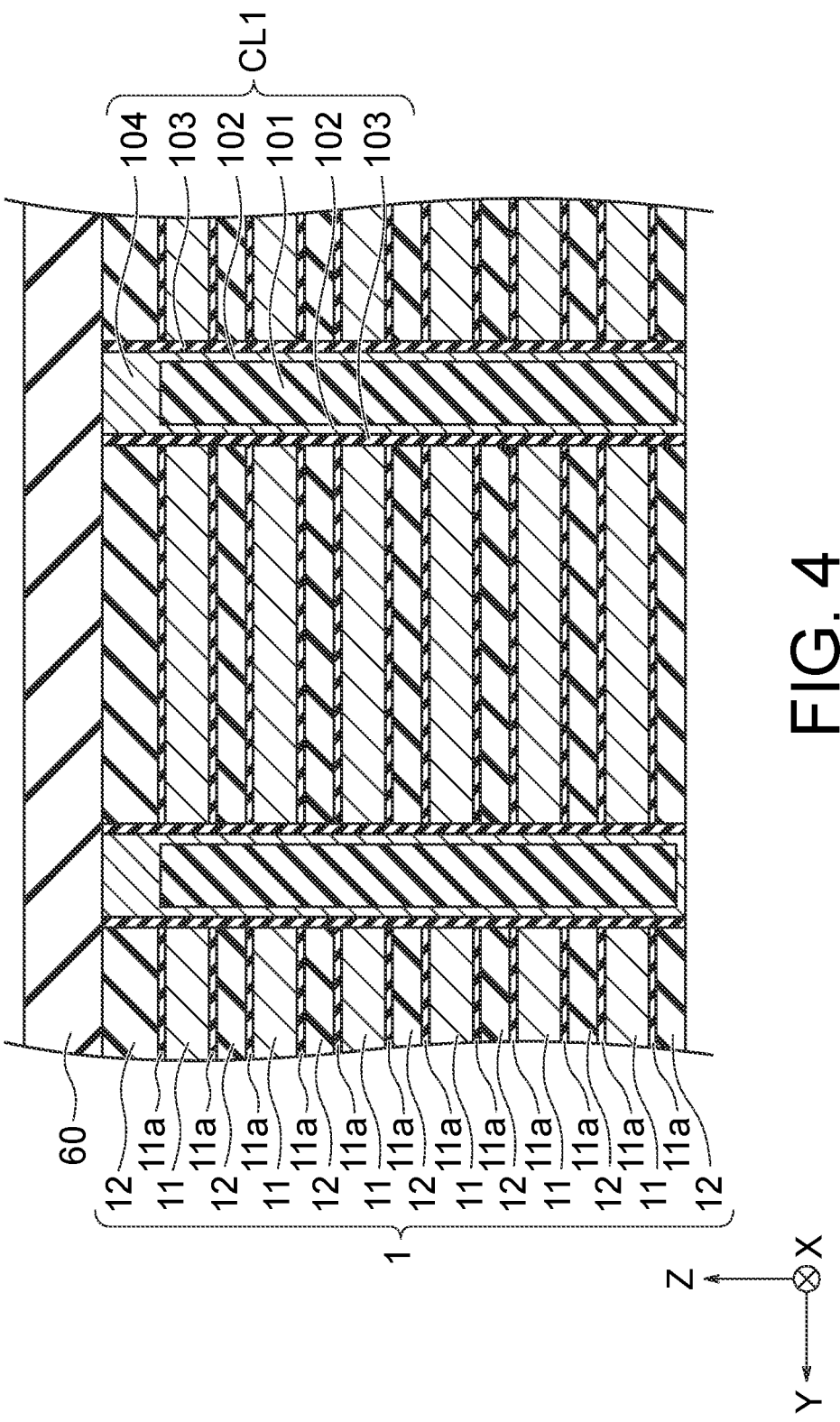

Next, a hard mask 60 is formed on the stack 1, as illustrated in FIG. 4. A silicon oxide film formed by using TEOS (TetraEthOxySilane), for example, is used as the hard mask 60.

Figure 5:
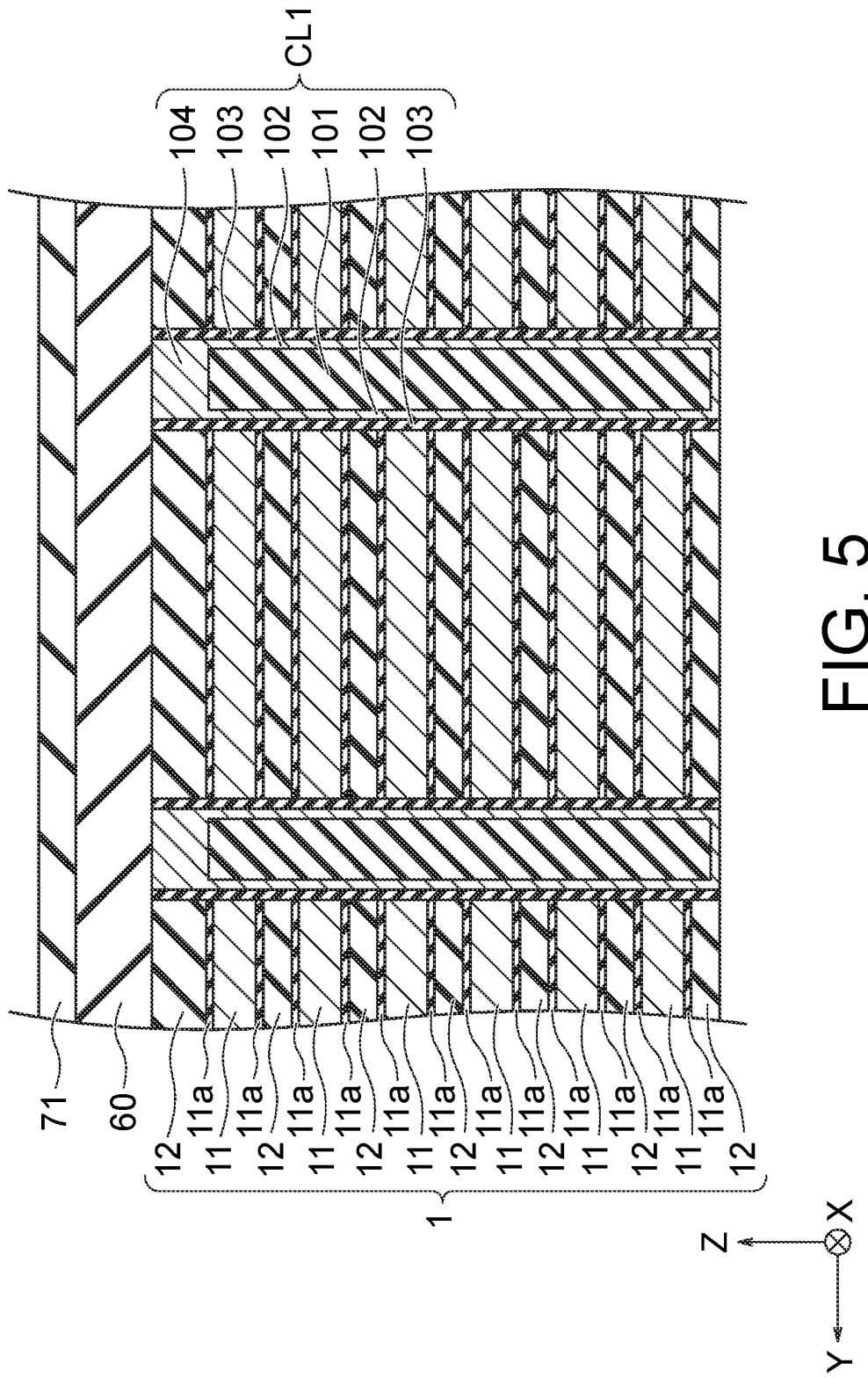

Next, a photoresist layer 71 is formed on the hard mask 60 by lithography, as illustrated in FIG. 5. The photoresist layer 71 is patterned to expose a region of the shallow slits SHE.

Figure 6:
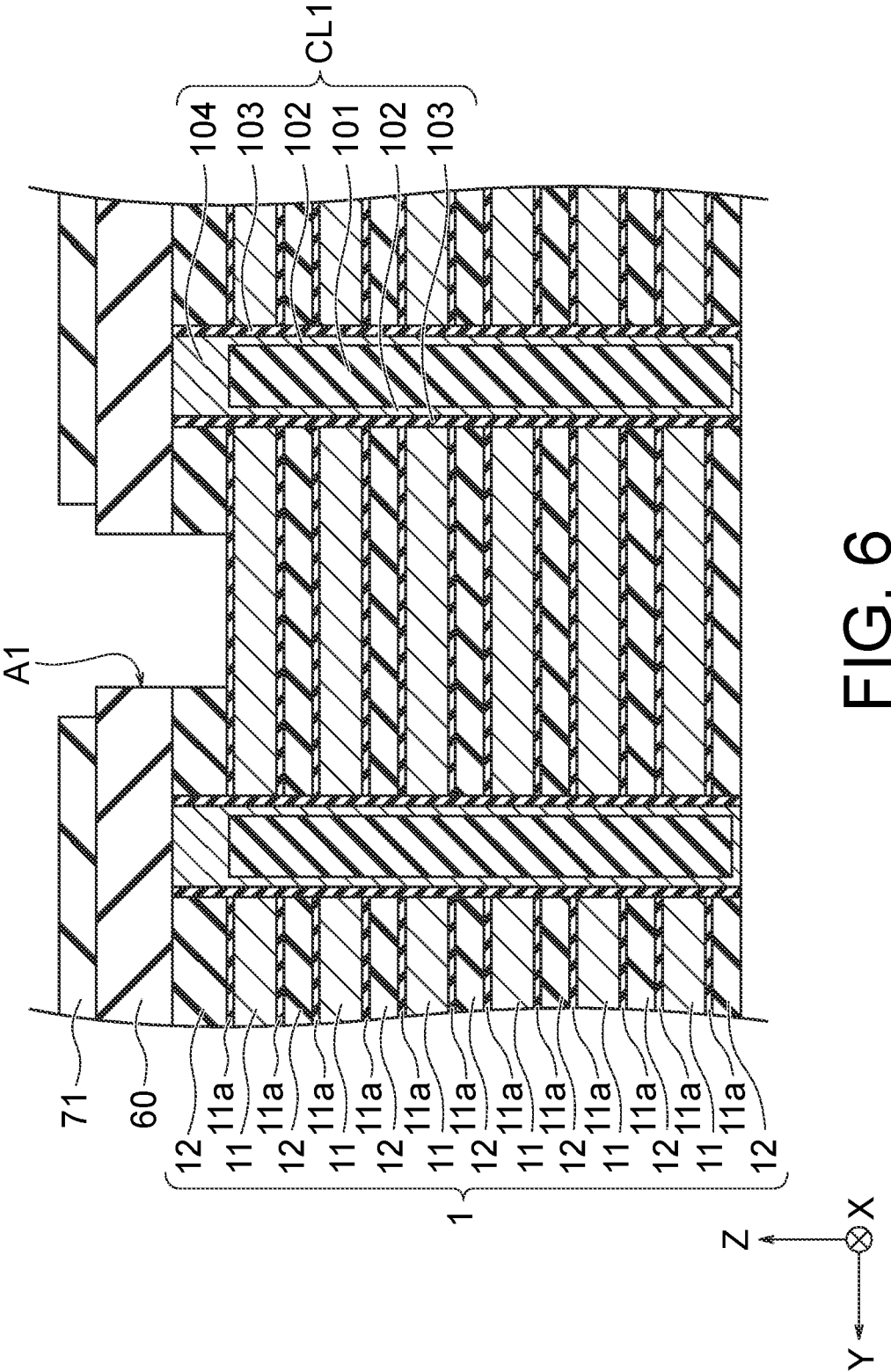

Next, the hard mask 60 is processed by etching using the photoresist layer 71 as a mask. Further, the insulation film 12 is processed by etching using the hard mask 60 as a mask. In this manner, an opening A1 is formed in the insulation film 12, as illustrated in FIG. 6.

Figure 7:
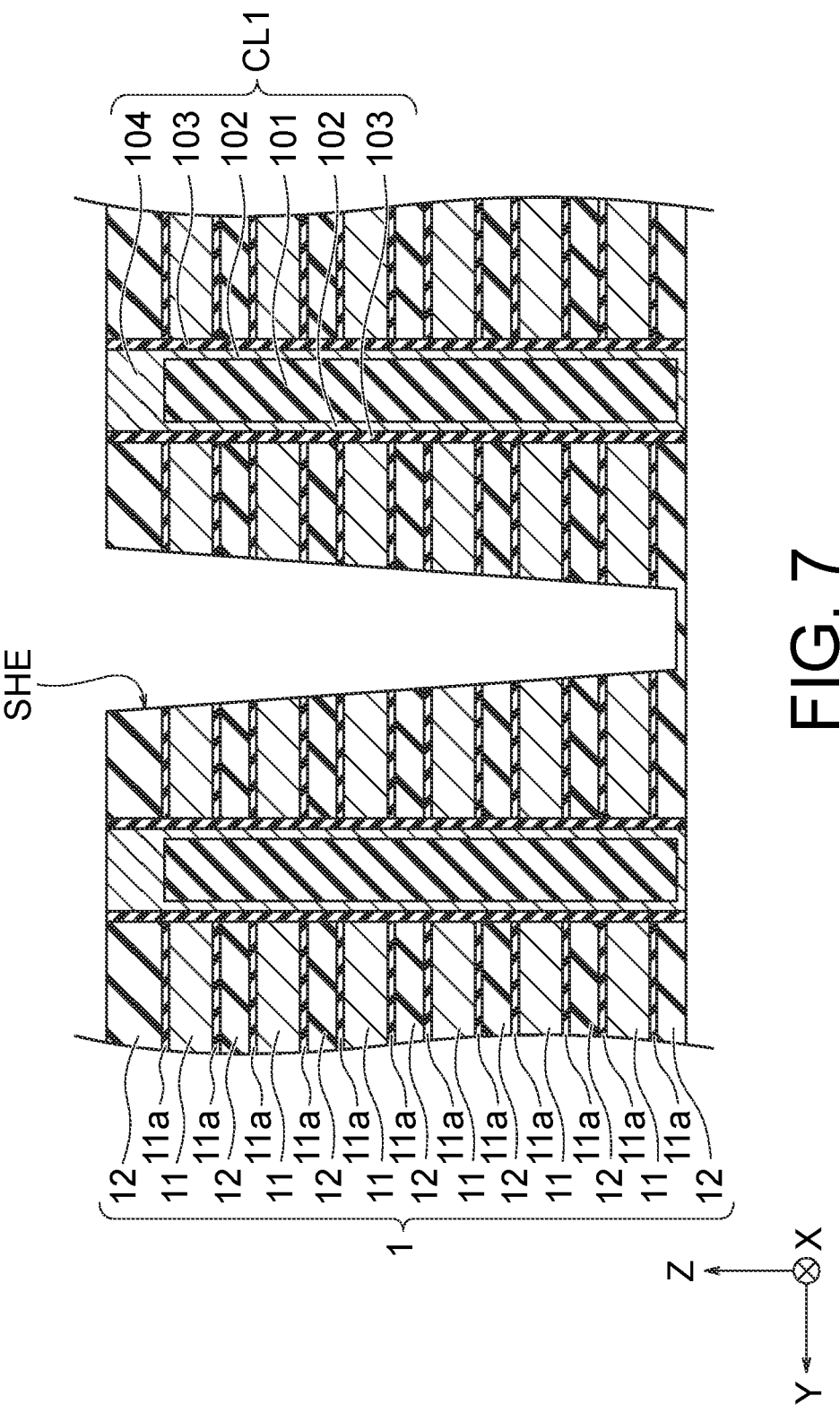

Next, the shallow slit SHE penetrating through an upper-layer portion of the stack 1 in the Z-direction is formed by etching, for example, RIE (Reactive Ion Etching) using the photoresist layer 71 and the hard mask 60 as a mask, as illustrated in FIG. 7. The cross-sectional shape of the shallow slit SHE may be, for example, a tapered shape in which the width of the top surface is wider than the width of the bottom surface.

Figure 8:
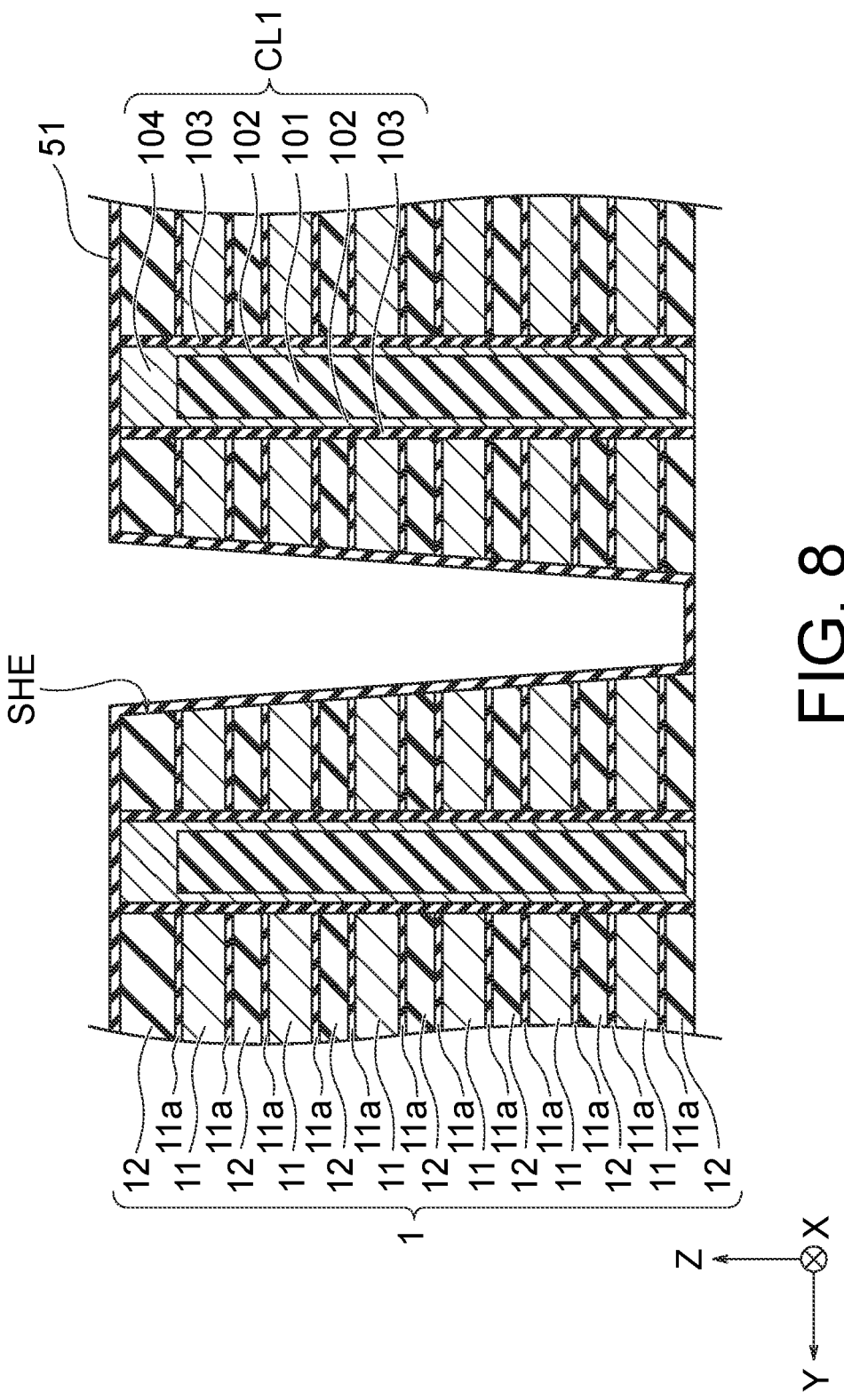

Next, the inner wall surface of the shallow slit SHE is covered with the barrier film 51, as illustrated in FIG. 8. A material having a larger PRF value than a silicon oxide film, for example, a silicon nitride film, aluminum oxide, aluminum nitride, or zirconium oxide is used for the barrier film 51. The thickness of the barrier film 51 is, for example, 3 to 10 nm and the barrier film 51 covers the inner wall surface with a substantially uniform thickness. The barrier film 51 is also formed on the top surface of the stack 1.

Figure 9:
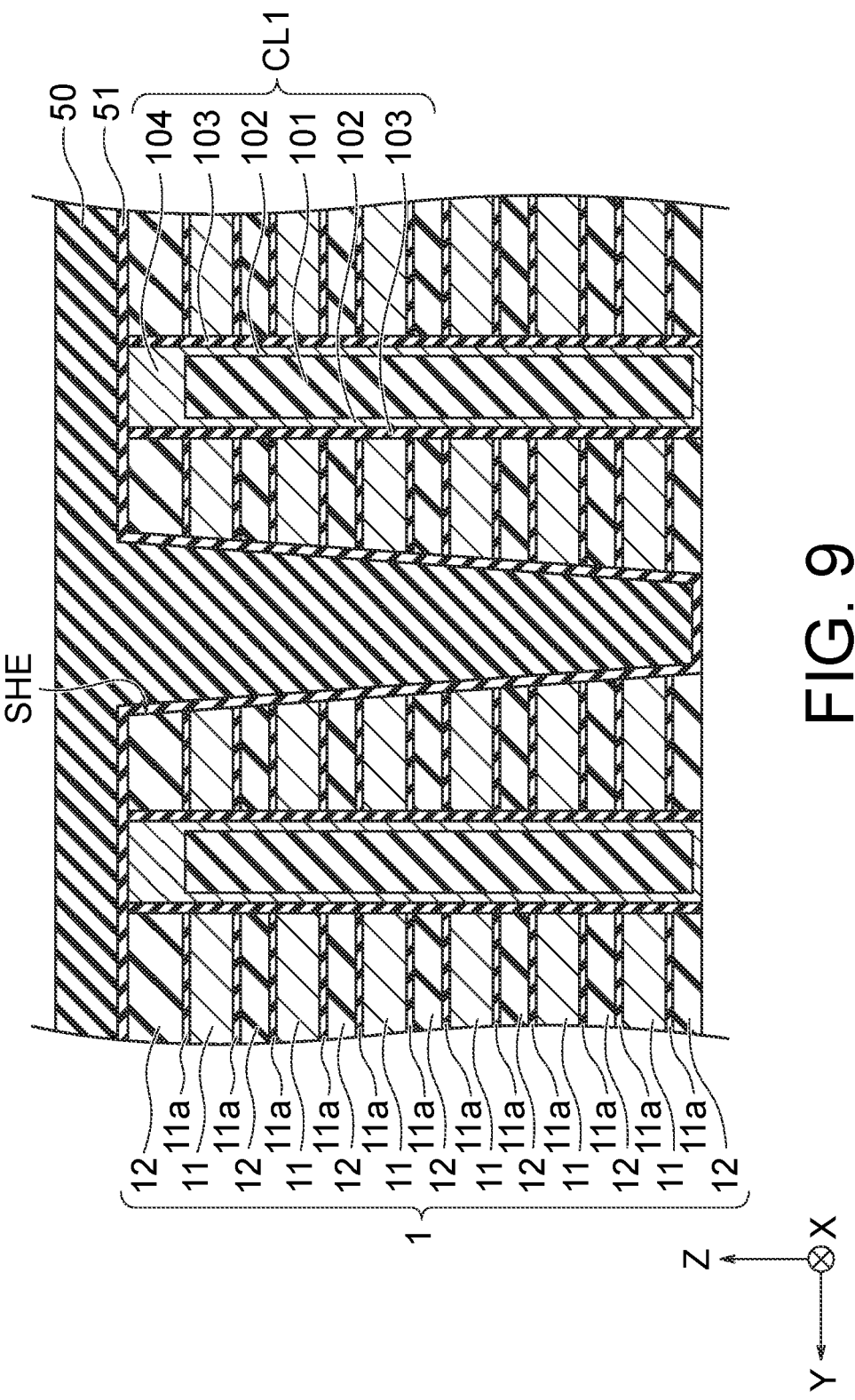

Next, the insulation film 50 is formed inside the barrier film 51 in the shallow slit SHE, as illustrated in FIG. 9. A material having a smaller PRF value than the barrier film 51, for example, a silicon oxide film is used for the insulation film 50. The insulation film 50 is also formed on the barrier film 51 on the stack 1.

Figure 10:
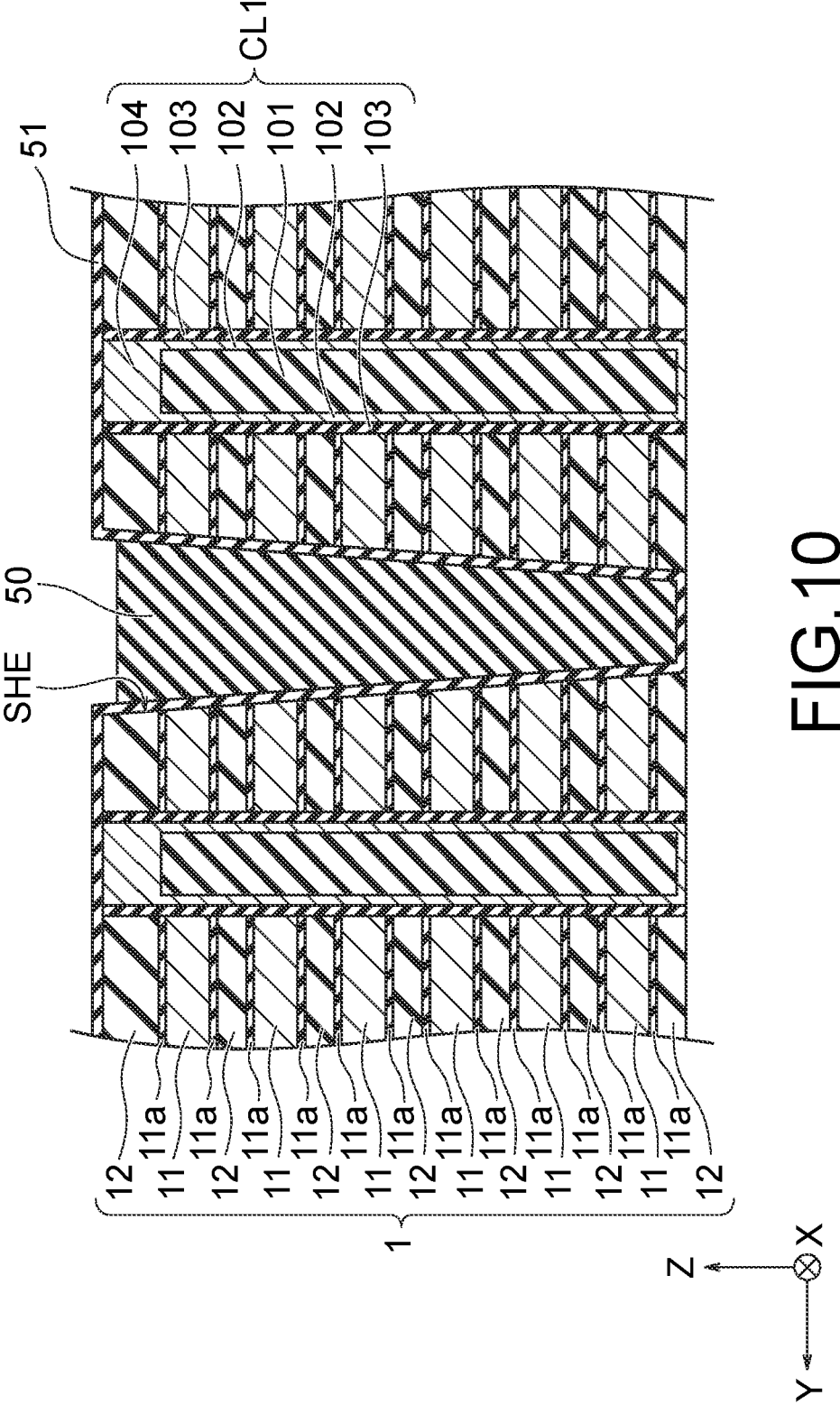

Next, the insulation film 50 formed on the stack 1 and the barrier film 51 is polished by CMP (Chemical Mechanical Polishing) or etched. At this time, the barrier film 51 can serve as a polishing stopper or an etching stopper. In this manner, the structure illustrated in FIG. 10 is obtained. The barrier film 51 covers the inner wall of the stack 1 in the shallow slit SHE, and the shallow slit SHE is filled with the insulation film 50 via the barrier film 51. The insulation film 50 in an upper portion of the shallow slit SHE may be somewhat removed. However, it is preferable that the height of the insulation film 50 in the shallow slit SHE is higher than the top surface of the uppermost conductive film 11 of the stack 1.

Figure 11:
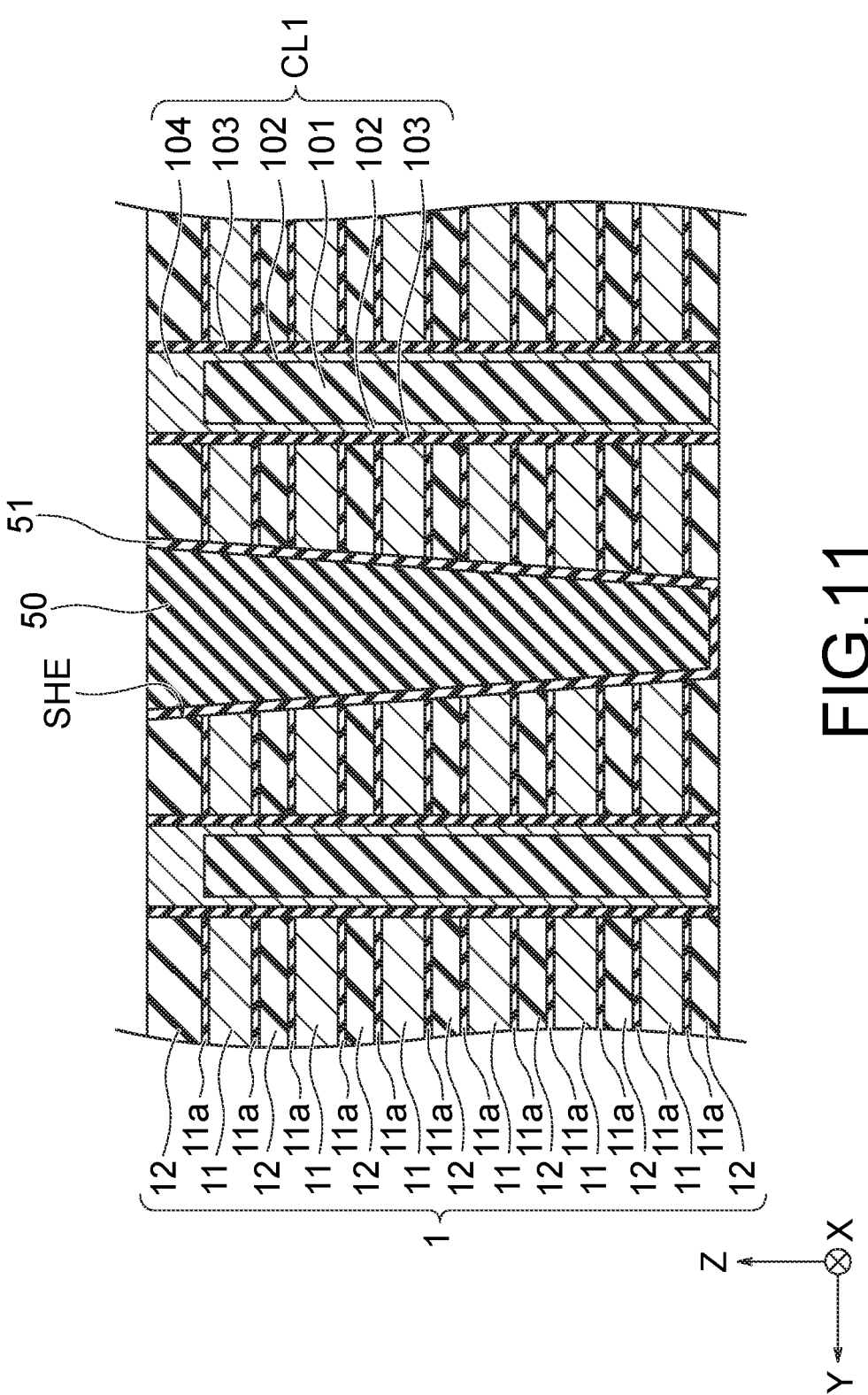

Next, the barrier film 51 formed on the stack 1 is removed by CMP or etching, as illustrated in FIG. 11. In this manner, the insulation film 50 and the barrier film 51 on the stack 1 are removed in a state where the insulation film 50 and the barrier film 51 (the isolation portions 50 and 51) in the shallow slit SHE are left. The barrier film 51 itself on the stack 1 does not specifically affect electric characteristics of a device such as the memory cell MC. Therefore, the barrier film 51 on the stack 1 may be left. In this case, the barrier film 51 can further suppress entrance of impurities such as hydrogen from outside.

Figure 12:
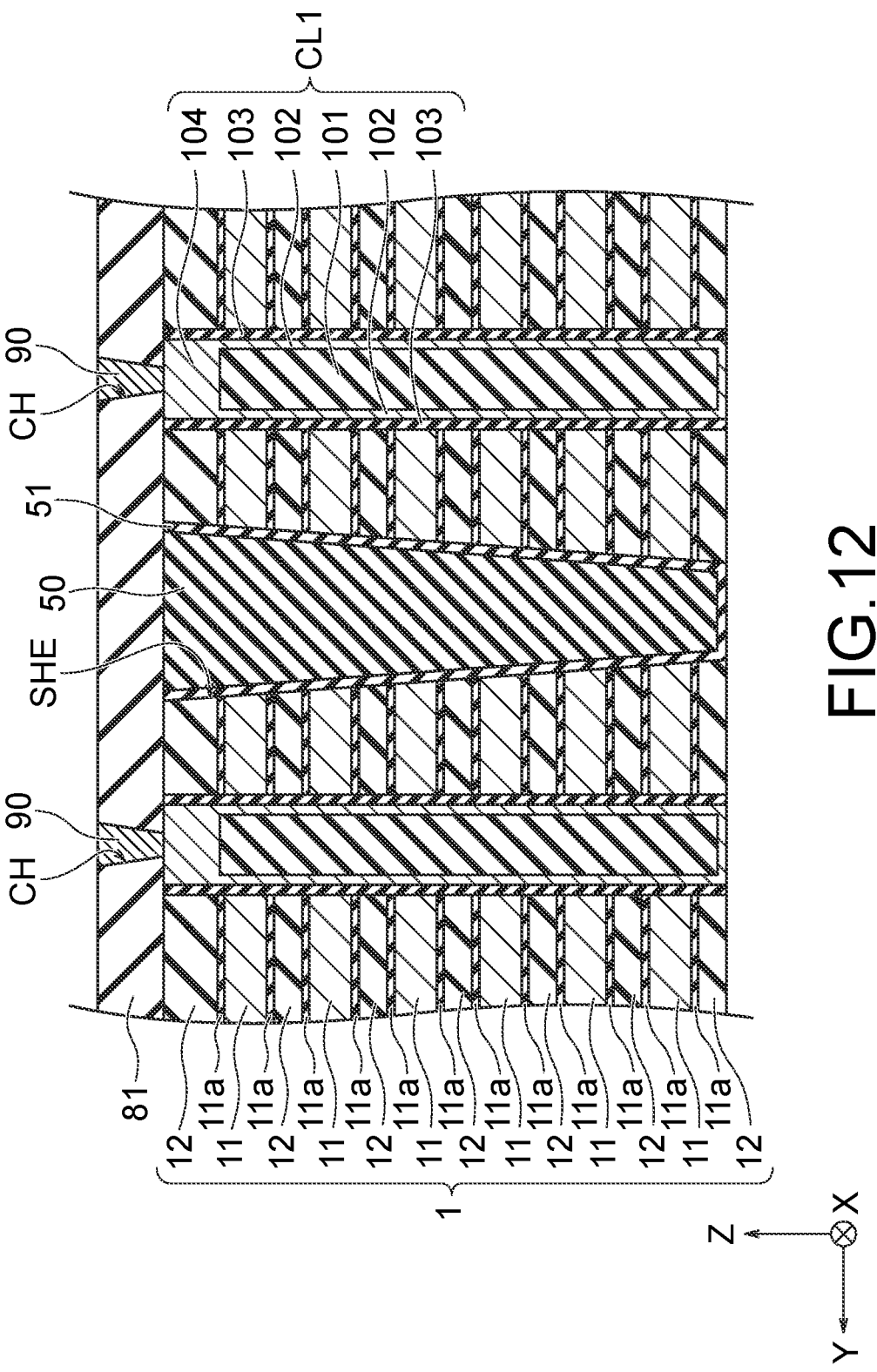

Next, the interlayer dielectric film 81 is formed on the stack 1, as illustrated in FIG. 12. Silicon oxide, for example, is used for the interlayer dielectric film 81. The interlayer dielectric film 81 is then processed by lithography and etching, whereby the contact hole CH is formed. The contact hole CH is formed to such a depth that the contact hole CH reaches the top surface of the cap layer 104, and may be substantially oval or substantially oblate in plan view as viewed from the Z-direction. The contact hole CH is then filled with titanium (Ti), titanium nitride (TiN), or tungsten (W) to form the contact plug 90. The contact plug 90 is then polished by CMP.

Thereafter, a via contact is formed on the contact hole CH, and a bit line is formed on the via contact. In this manner, the bit line is electrically connected to the column portion CL1 via the contact hole CH and the via contact. The bit line is provided to extend in a direction (the Y-direction) substantially perpendicular to an extending direction of the insulation film 50 in plan view as viewed from the Z-direction. Thereafter, another multilayer wiring structure or the like is formed, so that the semiconductor storage device 100 according to the first embodiment is completed.

As described above, according to the first embodiment, the barrier film 51 is formed between the conductive film 11 and the insulation film 50 and between the block film 11a and the insulation film 50. The barrier film 51 can suppress entrance of impurities such as hydrogen from the insulation film 50 to the conductive film 11 and the block film 11a, because the barrier film 51 is made of a material having a larger PRF value than a silicon oxide film. In this manner, it is possible to suppress deterioration of data retention characteristics of the memory cell MC.

Modification of First Embodiment

Figure 13:
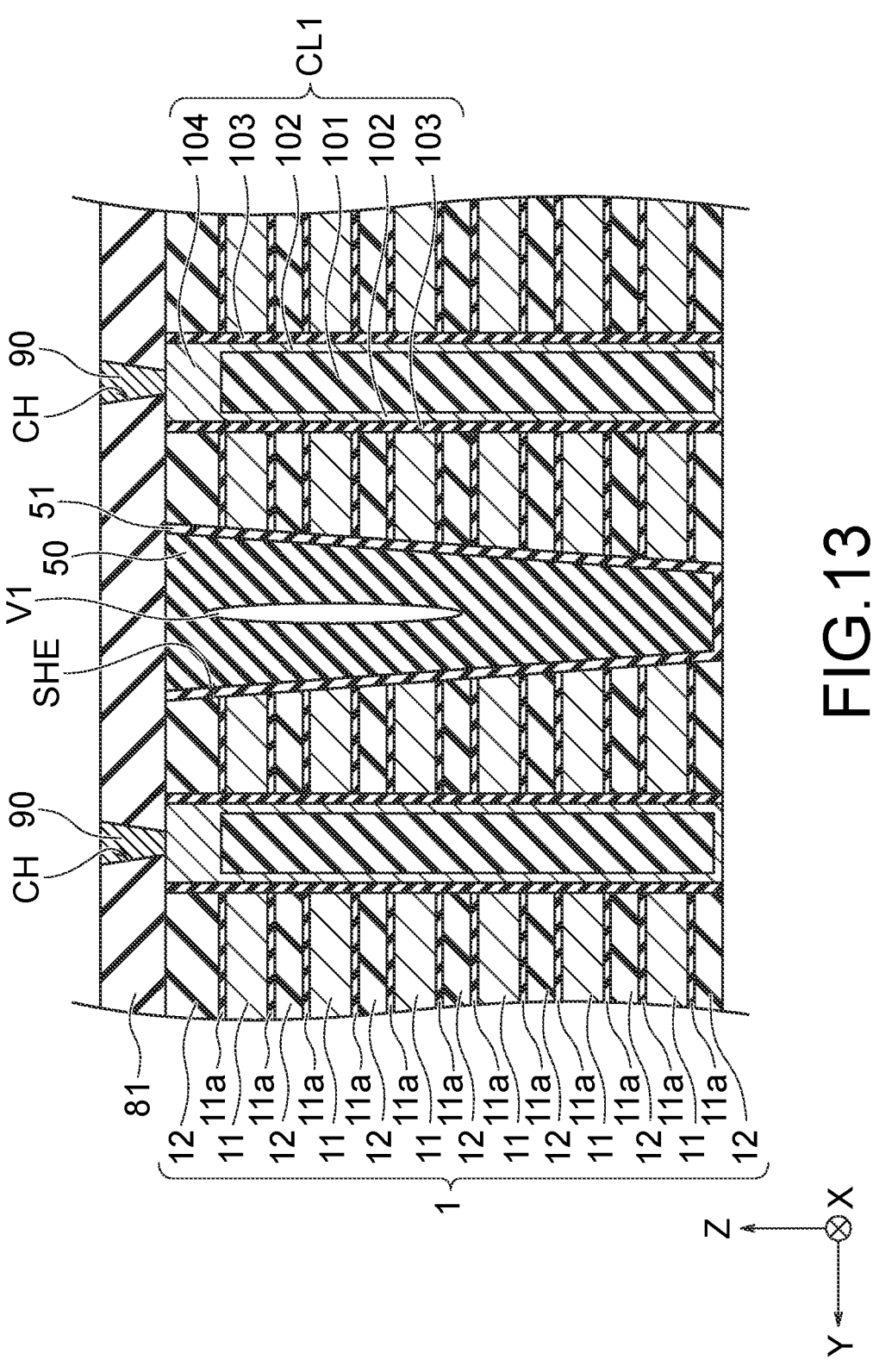
FIG. 13 is a cross-sectional view illustrating a configuration example of the semiconductor storage device according to a modification of the first embodiment.

FIG. 13 is a cross-sectional view illustrating a configuration example of the semiconductor storage device 100 according to a modification of the first embodiment. In the present modification, a void V1 is present in the insulation film 50. Even if the void V1 is present in the insulation film 50, the isolation portions 50 and 51 can have identical functions to those of the isolation portions in the first embodiment. Further, the barrier film 51 can suppress entrance of impurities such as hydrogen from the insulation film 50 to the conductive film 11 and the block film 11a. The void V1 also serves as an air gap and can provide an effect of improving electrical isolation characteristics of the isolation portions 50 and 51. Other configurations in the present modification may be identical to corresponding ones in the first embodiment. Therefore, effects identical to those of the first embodiment can be obtained in the present modification.

Second Embodiment

Figure 14:
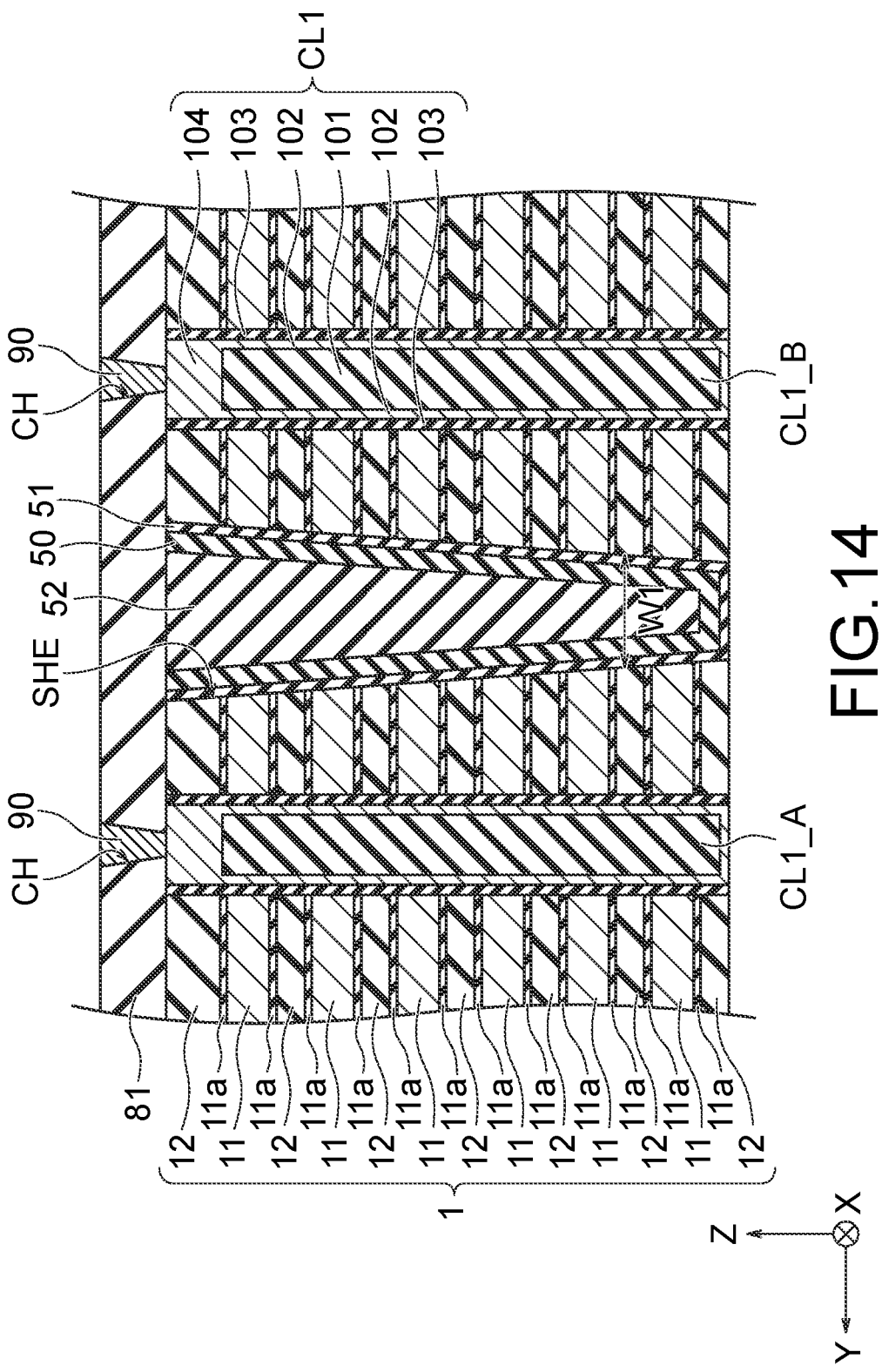
FIG. 14 is a cross-sectional view illustrating a configuration example of the semiconductor storage device according to a second embodiment.

FIG. 14 is a cross-sectional view illustrating a configuration example of the semiconductor storage device 100 according to a second embodiment. The semiconductor storage device 100 according to the second embodiment is further provided with an insulation film 52 inside the insulation film 50. The barrier film 51 is provided on the inner wall surface of the shallow slit SHE (the first isolation portion), and the insulation film 50 is provided inside the barrier film 51. Further, the inside of the insulation film 50 in the shallow slit SHE is filled with the insulation film 52. The insulation film 52 is an example of a fourth insulation film. An insulating material that can easily trap electric charges, for example, a silicon nitride film (SiN) is used for the insulation film 52. Accordingly, the shallow slit SHE is filled with the insulation film 50 (the silicon oxide film) and the insulation film 52 (the silicon nitride film). The isolation portion is configured by the portions 50 to 52 in the second embodiment. The barrier film 51, the insulation film 50 (the silicon oxide film), the insulation film 52 (the silicon nitride film), the insulation film 50 (the silicon oxide film), and the barrier film 51 are stacked in the Y-direction between the conductive films 11 (the word lines WL) adjacent to each other with the shallow slit SHE interposed therebetween. Accordingly, an ONO film formed by the insulation film 50 (the silicon oxide film), the insulation film 52 (the silicon nitride film), and the insulation film 50 (the silicon oxide film) is present between the conductive films 11 adjacent to each other with the shallow slit SHE interposed therebetween.

Next, an effect of relaxing an electric field is described, which is provided by the shallow slit SHE and its internal structure. In a data write/erase operation, the semiconductor storage device 100 applies an electric field to the column portion CL1 via the selection transistors STS and STD. In this manner, the column portion CL1 for which the data write/erase operation is performed is selected (a selected string). For example, in FIG. 14, an electric field is applied to a column portion CL1_A, assuming that the column portion CL1_A is a selected string. Meanwhile, it is assumed that a column portion CL1_B is a non-selected string, and no electric field is applied thereto.

In this case, the drain-side selection gate SGD of the drain-side selection transistor STD corresponding to the column portion CL1_A rises to a high-level voltage. The drain-side selection gate SGD of the drain-side selection transistor STD corresponding to the column portion CL1_B maintains a low-level voltage. Accordingly, in the isolation portions 50 to 52 in the shallow slit SHE between the column portion CL1_A and the column portion CL1_B, a potential difference is generated between the high-level voltage side and the low-level voltage side of the drain-side selection gate SGD. Therefore, as for the shallow slit SHE, it is necessary to ensure a width equal to or wider than a certain width W1 (for example, 20 nm or more) in order to guarantee a breakdown voltage against the potential difference between the high-level voltage and the low-level voltage of the drain-side selection gate SGD.

However, it may be impossible to ensure the width equal to or wider than W1 as the width of the shallow slit SHE because of downscaling of the memory cell array portion 1m. In this case, the shallow slit SHE cannot guarantee the breakdown voltage against the potential difference between the high-level voltage and the low-level voltage of the drain-side selection gate SGD. In addition, there is a possibility that the insulation films 50 and 52 cannot be formed sufficiently in the shallow slit SHE when the width of each shallow slit SHE becomes narrower. Also in this case, the shallow slit SHE cannot guarantee the breakdown voltage against the potential difference between the high-level voltage and the low-level voltage of the drain-side selection gate SGD.

Further, in a case of setting the width of the bottom surface of the shallow slit SHE to W1 or more, an upper portion of the shallow slit SHE which is wider than the bottom surface thereof may come in contact with the column portion CL1 and cause a failure of the drain-side selection gate SGD.

Accordingly, in the second embodiment, the insulation film 52 (the silicon nitride film) is further provided inside the insulation film 50 (the silicon oxide film) in the shallow slit SHE. The insulation film 52 is made of, for example, a material that can easily trap electric charges, such as a silicon nitride film. In this manner, the insulation film 52 traps electric charges to relax an electric field generated in the isolation portions 50 to 52 between the drain-side selection gate SGD of a selected string and the drain-side selection gate SGD of a non-selected string. As a result, it is possible to guarantee the breakdown voltage of the isolation portions 50 to 52 between the non-selected string and the selected string.

Figures 15A, 15B:
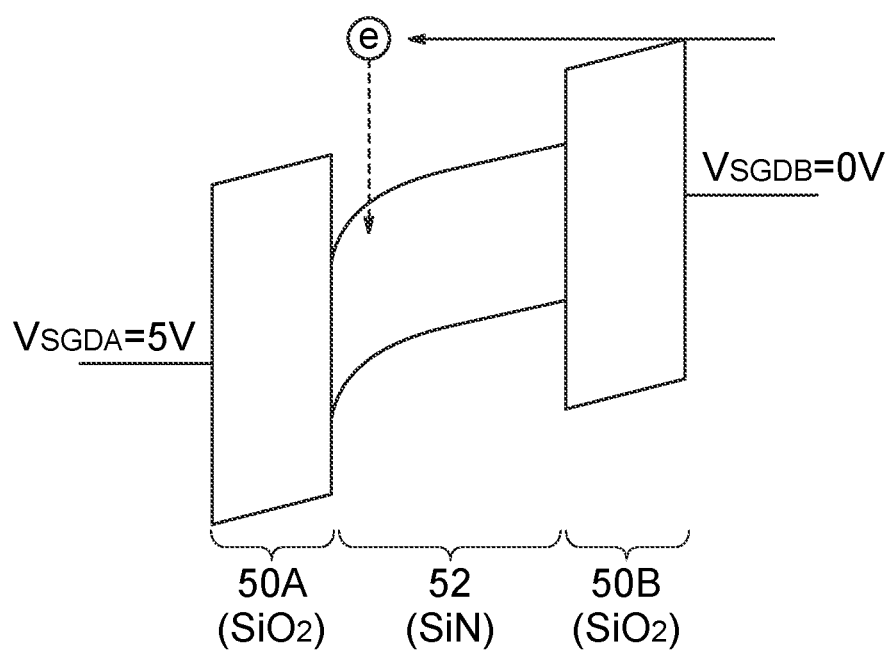
FIGS. 15A and 15B are energy band diagrams in the shallow slit and the conductive films adjacent thereto on both sides.

FIGS. 15A and 15B are energy band diagrams in the shallow slit SHE and the conductive films 11 (the word lines WL) adjacent thereto on both sides. An effect of relaxing an electric field between a non-selected string and a selected string provided by the insulation film 52 is described in more detail with reference to FIGS. 15A and 15B.

FIG. 15A illustrates an energy band structure in data reading. In data reading, a potential difference is generated in the isolation portions 50 to 52 located between the drain-side selection gate SGD of a selected string and the drain-side selection gate SGD of a non-selected string, as described above. For example, it is assumed that a high-level voltage ($V_{SGDA}$=5V) is applied to the drain-side selection gate SGD of the selected string and a low-level voltage ($V_{SGDB}$=0V) is applied to the drain-side selection gate SGD of the non-selected string. In this case, electrons migrate from an insulation film 50B on the non-selected string side to an insulation film 50A on the selected string side. That is, a leak current is generated in the shallow slit SHE, which flows from the insulation film 50A to the insulation film 50B. The insulation film 50A is the insulation film 50 located on the left in the isolation portions in FIG. 14. The insulation film 50B is the insulation film 50 located on the right in the isolation portions in FIG. 14.

In a case where the insulation film 52 is not provided, a leak current is likely to flow from the insulation film 50A to the insulation film 50B. In particular, in a case where the width of the shallow slit SHE, that is, the width of the isolation portions 50 to 52 is narrower than W1, the leak current is likely to pass through the isolation portions 50 to 52.

Meanwhile, in a case where the insulation film 52 is provided, the insulation film 52 located between the insulation film 50A and the insulation film 50B traps the electrons that migrate by this leak current, as illustrated in FIG. 15A.

As illustrated in FIG. 15B, the energy level of the insulation film 52 is raised by trapping and storing of electrons by the insulation film 52. Consequently, a gradient of the potential difference between the insulation film 50A and the insulation film 50B becomes gentle. In other words, storing of electrons in the insulation film 52 causes rise of an energy barrier between the insulation film 50A and the insulation film 50B. Accordingly, migration of electrons is suppressed, so that the leak current is suppressed. In this manner, the insulation film 52 can increase the breakdown voltage of the isolation portions 50 to 52.

Other configurations in the second embodiment may be identical to corresponding ones in the first embodiment. Therefore, the second embodiment can obtain effects identical to those of the first embodiment. The effect of relaxing the electric field by the insulation film 52 is generated when the barrier film 51 is not provided. The effect of maintaining the breakdown voltage of the isolation portions 50 to 52 to be high can be obtained as long as the insulation film 52 is provided in the insulation film 50. The isolation portions according to the second embodiment can be formed by, after the process that has been described with reference to FIG. 9, forming a trench in the insulation film 50 in the shallow slit SHE and then embedding the insulation film 52 in this trench, for example.

Modification of Second Embodiment

Figure 16:
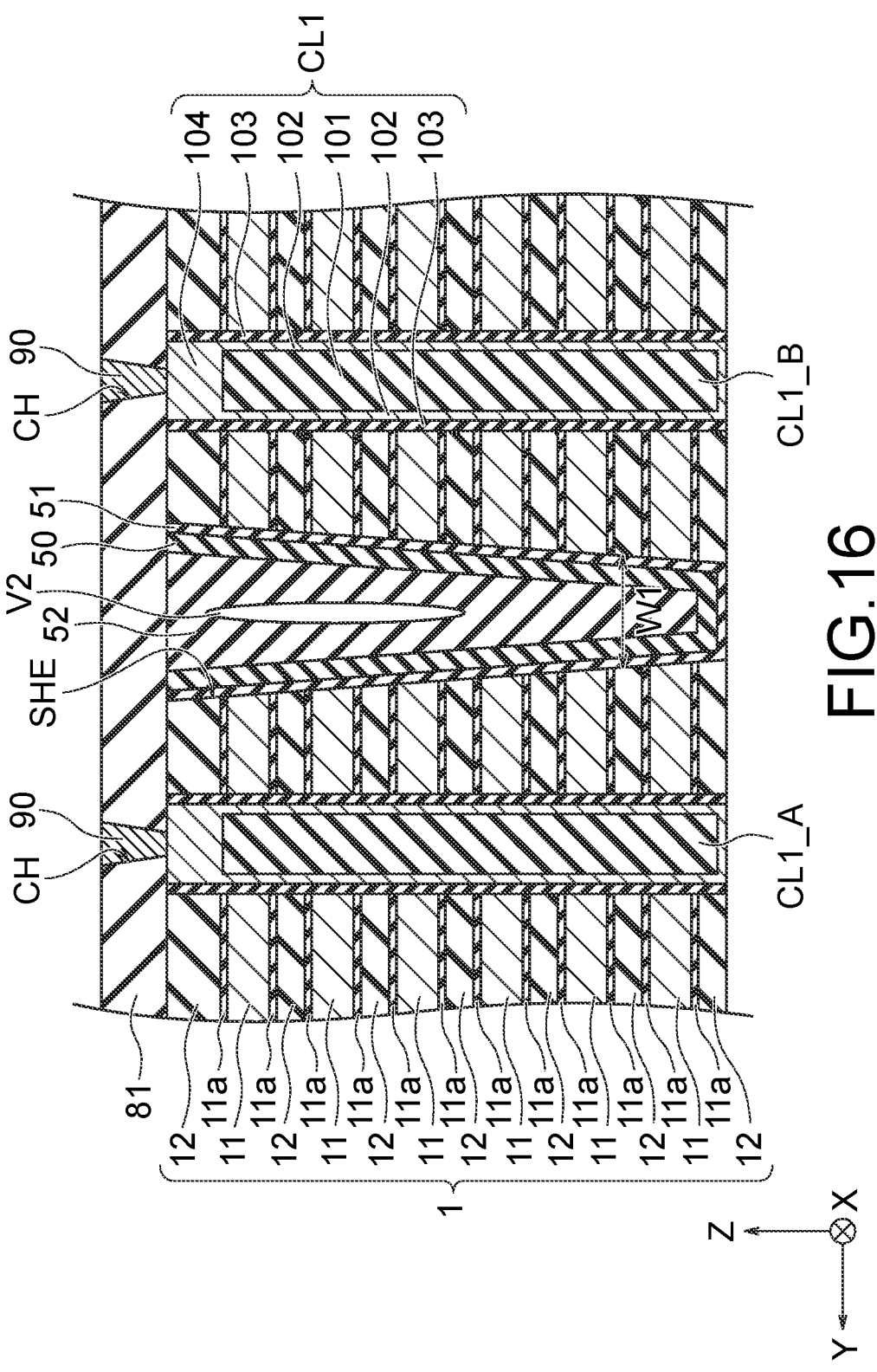
FIG. 16 is a cross-sectional view illustrating a configuration example of the semiconductor storage device according to a modification of the second embodiment.

FIG. 16 is a cross-sectional view illustrating a configuration example of the semiconductor storage device 100 according to a modification of the second embodiment. In the present modification, a void V2 is present in the insulation film 52. Even if the void V2 is present in the insulation film 52, the isolation portions 50 to 52 can serve as the isolation portions according to the second embodiment. Further, the barrier film 51 can suppress entrance of impurities such as hydrogen from the insulation film 50 to the conductive film 11 and the block film 11*a*. Other configurations in the present modification may be identical to corresponding ones in the second embodiment. Therefore, effects identical to those of the second embodiment can be obtained also in the present modification. The void V2 also serves as an air gap and can provide an effect of further improving electrical isolation characteristics of the isolation portions 50 to 52.

Third Embodiment

Figure 17:
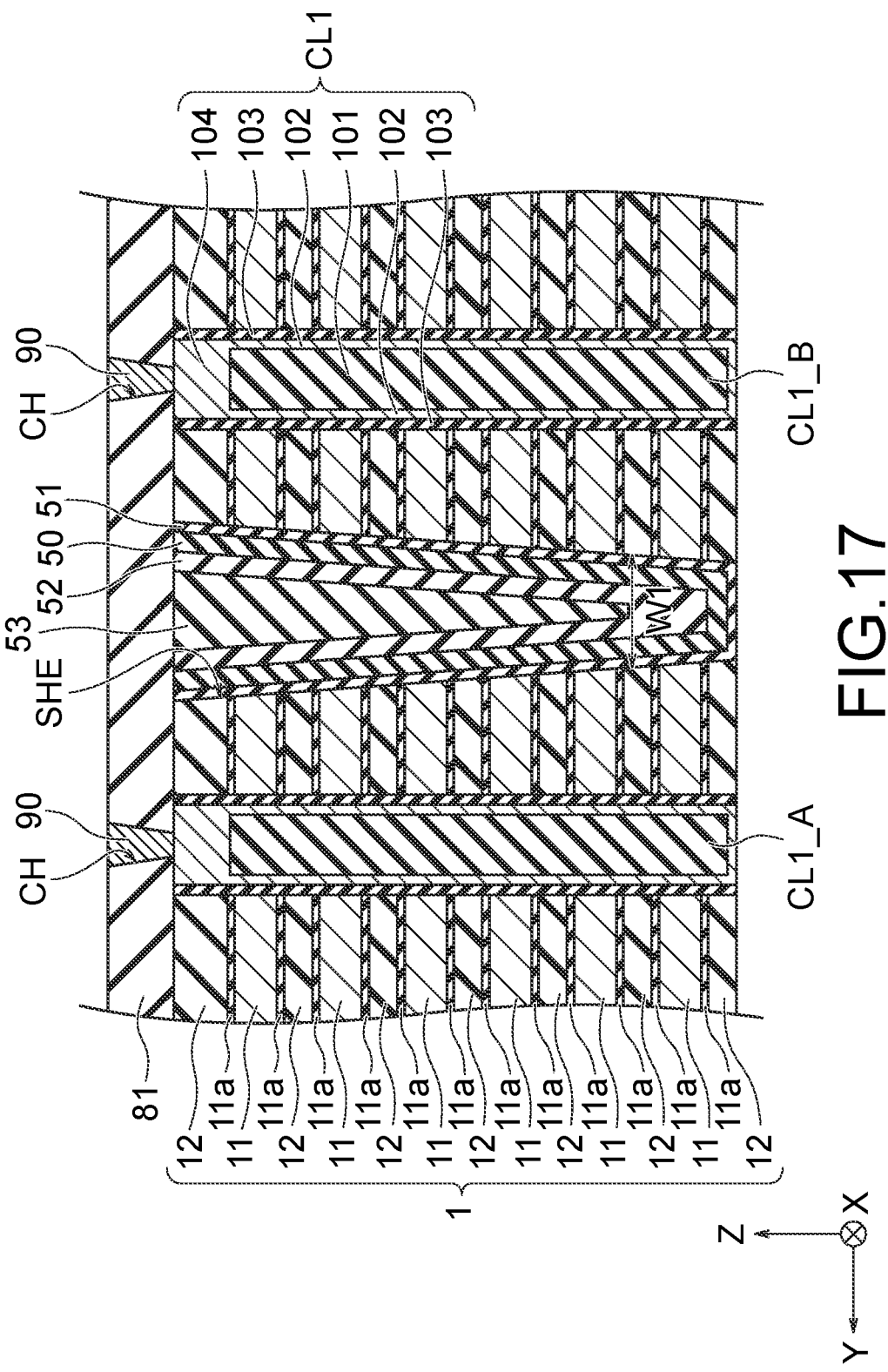
FIG. 17 is a cross-sectional view illustrating a configuration example of the semiconductor storage device according to a third embodiment.

FIG. 17 is a cross-sectional view illustrating a configuration example of the semiconductor storage device 100 according to a third embodiment. In the third embodiment, an insulation film 53 is further provided inside the insulation film 52. The barrier film 51 is provided on the inner wall surface of the shallow slit SHE (the first isolation portion), and the insulation film 50 is formed inside the barrier film 51. The insulation film 52 is provided inside the insulation film 50, and the insulation film 53 is further provided inside the insulation film 52. The insulation film 53 is an example of a fifth insulation film. A material having a lower relative permittivity than the insulation film 52 (SiN), for example, a silicon oxide film ($SiO_2$) is used for the insulation film 53. The isolation portion is configured by the portions 50 to 53 in the third embodiment.

The insulation film 52 can raise a breakdown voltage of the isolation portion by trapping electric charges in an identical manner to that in the second embodiment. Therefore, effects identical to those in the second embodiment can be also obtained in the third embodiment.

Next, functions of the insulation film 53 are described.

The isolation portion according to the third embodiment further includes the insulation film 53 (the silicon oxide film) formed inside the insulation film 52 (the silicon nitride film). The insulation film 53 is formed in the insulation film 52 according to the second embodiment. The insulation film 53 is made of a material having a lower relative permittivity than the insulation film 52 (for example, the silicon nitride film), such as a silicon oxide film. Therefore, the isolation portion according to the third embodiment formed by the barrier film 51, the insulation film 50, the insulation film 52, and the insulation film 53 has a lower relative permittivity as compared with the isolation portion according to the second embodiment formed by the barrier film 51, the insulation film 50, and the insulation film 52. Accordingly, an electric field generated in the isolation portion according to the third embodiment is relaxed, and therefore an effect of maintaining the breakdown voltage of the isolation portions 50, 52, and 53 to be higher is obtained. That is, the isolation portion can relax the potential difference between the drain-side selection gate SGD on a selected string side and the drain-side selection gate SGD on a non-selected string side more satisfactorily.

Other configurations in the third embodiment may be identical to corresponding ones in the first embodiment. Therefore, effects identical to those in the first embodiment can be obtained also in the third embodiment. In the third embodiment, the barrier film 51 may be omitted similarly to the second embodiment. As long as the insulation films 52 and 53 are provided in the barrier film 50, effects of the second and third embodiments can be obtained.

The isolation portions 50 to 53 according to the third embodiment are formed in the following manner. For example, after the process that has been described with reference to FIG. 9, a trench is formed in the insulation film 50 in the shallow slit SHE, and the insulation film 52 is embedded in this trench. Thereafter, a trench is further formed in the insulation film 52, and the insulation film 53 is embedded in this trench. In this manner, the isolation portions 50 to 53 according to the third embodiment are formed.

Modification of Third Embodiment

Figure 18:
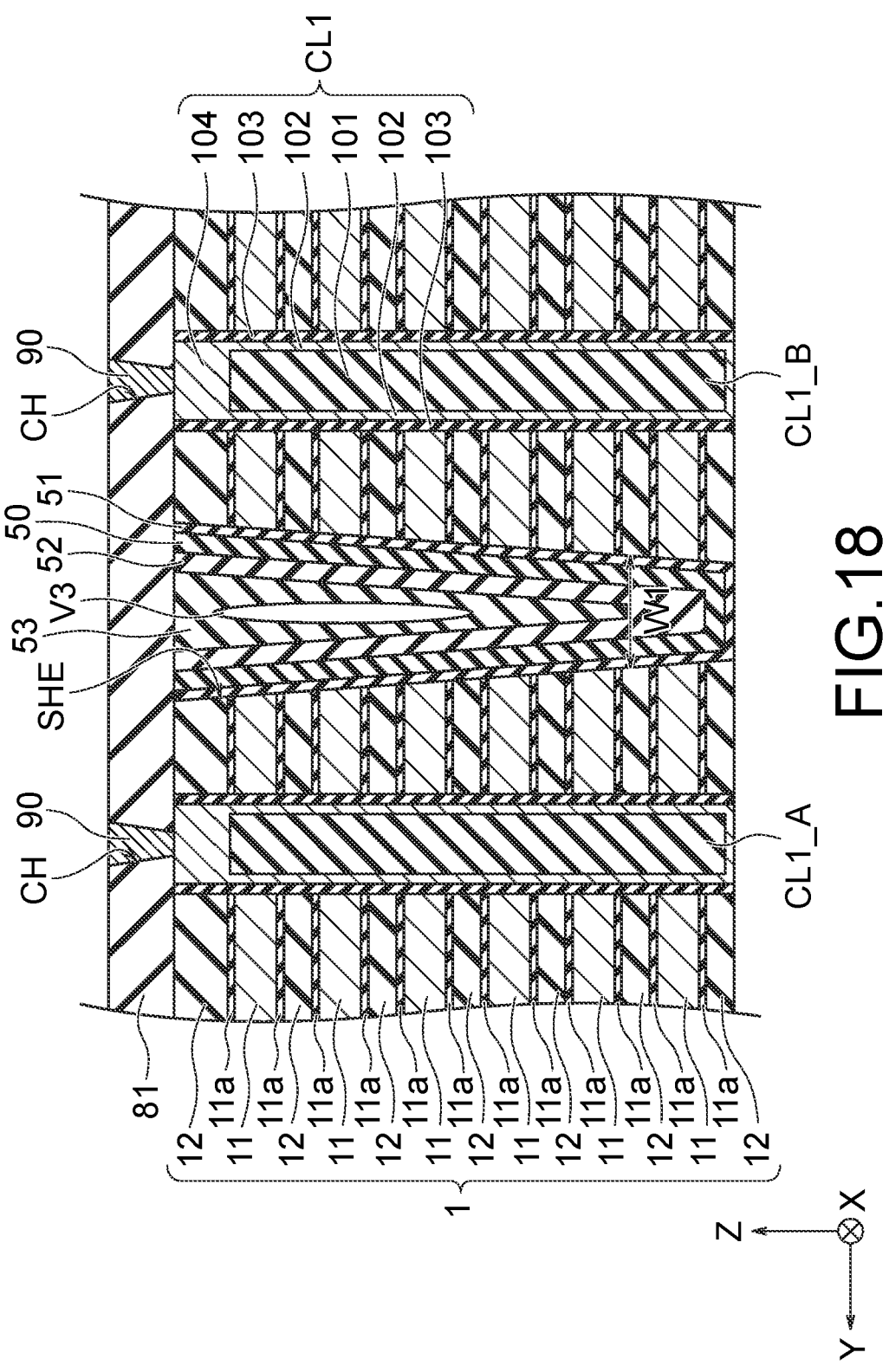
FIG. 18 is a cross-sectional view illustrating a configuration example of the semiconductor storage device according to a modification of the third embodiment.

FIG. 18 is a cross-sectional view illustrating a configuration example of the semiconductor storage device 100 according to a modification of the third embodiment. In the present modification, a void V3 is present in the insulation film 53. Even if the void V3 is present in the insulation film 53, the shallow slit SHE can serve as an isolation portion. Further, the barrier film 51 can suppress entrance of impurities such as hydrogen from the insulation film 50 to the conductive film 11 and the block film 11*a*. Other configurations in the present modification may be identical to corresponding ones in the third embodiment. Therefore, effects identical to those of the third embodiment can be obtained also in the present modification. The void V3 also serves as an air gap and can provide an effect of further improving electrical isolation characteristics of the isolation portions 50 and 51.

Figure 19:
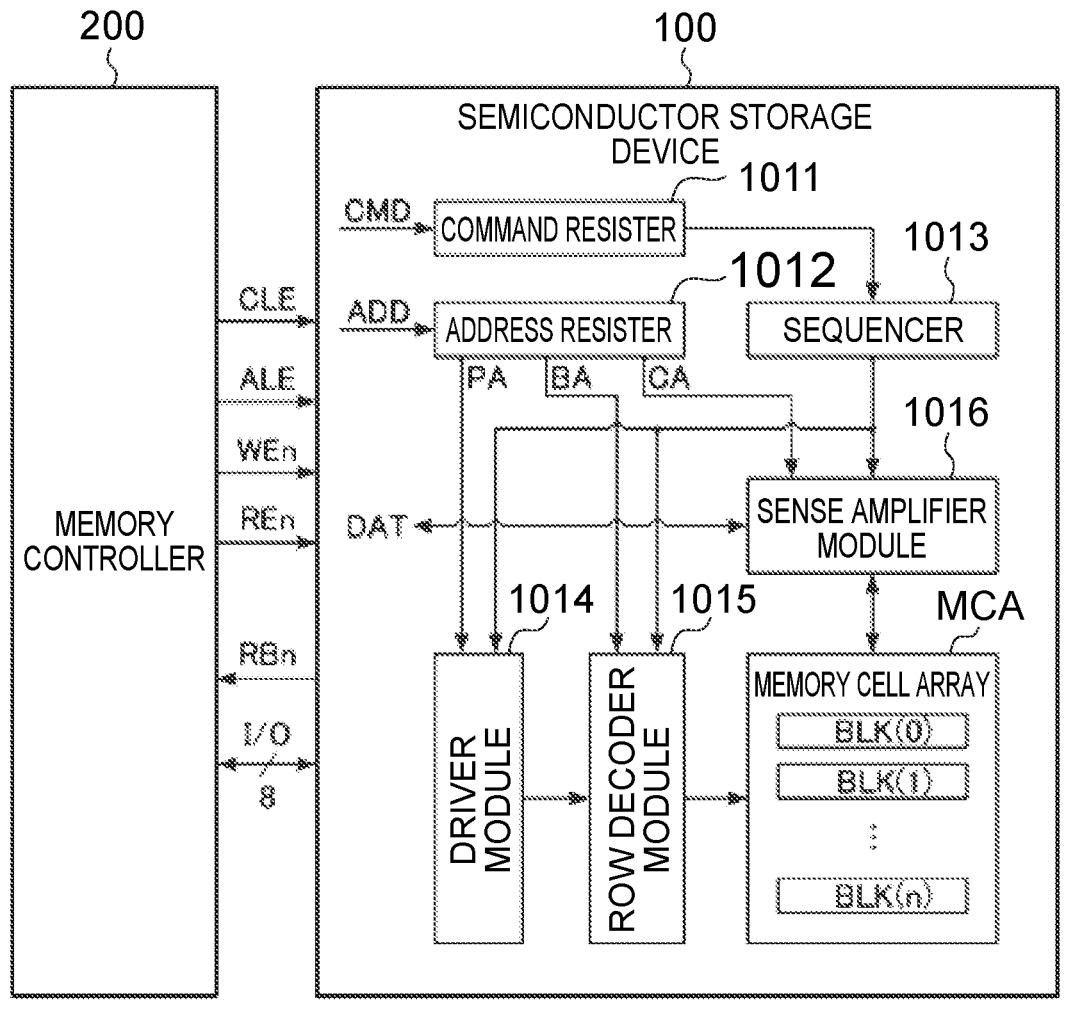
FIG. 19 is a block diagram illustrating a configuration example of a semiconductor storage device to which any of the embodiments described above is applied.

FIG. 19 is a block diagram illustrating a configuration example of a semiconductor storage device to which any of the embodiments described above is applied. The semiconductor storage device 100 is a NAND flash memory that can store therein data in a non-volatile manner, and is controlled by an external memory controller 200. Communication between the semiconductor storage device 100 and the memory controller 200 supports, for example, a NAND interface standard.

As illustrated in FIG. 19, the semiconductor storage device 100 includes, for example, the memory cell array MCA, a command resister 1011, an address resister 1012, a sequencer 1013, a driver module 1014, a row decoder module 1015, and a sense amplifier module 1016.

The memory cell array MCA includes a plurality of blocks BLK(0) to BLK(n) (n is an integer of 1 or more). Each block BLK is a set of a plurality of memory cells capable of storing therein data in a non-volatile manner and is used as, for example, the unit of erasing data. The memory cell array MCA is provided with a plurality of bit lines and a plurality of word lines. Each memory cell is associated with one bit line and one word line, for example. The detailed configuration of the memory cell array MCA will be described later.

The command resister 1011 retains a command CMD that the semiconductor storage device 100 has received from the memory controller 200. The command CMD includes, for example, an instruction to the sequencer 1013 to perform a read operation, a write operation, an erase operation, or the like.

The address resister 1012 retains address information ADD that the semiconductor storage device 100 has received from the memory controller 200. The address information ADD includes, for example, a block address BA, a page address PA, and a column address CA. For example, the block address BA, the page address PA, and the column address CA are used for selecting the blocks BLK, the word lines, and the bit lines, respectively.

The sequencer 1013 controls the operation of the whole semiconductor storage device 100. For example, the sequencer 1013 controls the driver module 1014, the row decoder module 1015, the sense amplifier module 1016, and the like based on the command CMD retained in the command resister 1011 to perform a read operation, a write operation, an erase operation, and the like.

The driver module 1014 generates a voltage used in a read operation, a write operation, an erase operation, or the like. The driver module 1014 applies the generated voltage to a signal line corresponding to a selected word line based on, for example, the page address PA retained in the address register 1012.

The row decoder module 1015 includes a plurality of row decoders RD. The row decoder RD selects, based on the block address BA retained in the address resister 1012, one block BLK in the memory cell array MCA corresponding to that address. The row decoder RD transfers, for example, the voltage applied to the signal line corresponding to the selected word line to the selected word line in the selected block BLK.

The sense amplifier module 1016 applies a desired voltage to each bit line in accordance with write data DAT received from the memory controller 200 in a write operation. Further, in a read operation, the sense amplifier module 1016 determines data stored in a memory cell based on a voltage of a bit line and transfers the determination result to the memory controller 200 as read data DAT.

The semiconductor storage device 100 and the memory controller 200 that are described above may configure one semiconductor device by being combined with each other. Examples of such a semiconductor device include a memory card, such as an SD™ card, and an SSD (Solid State Drive).

Figure 20:
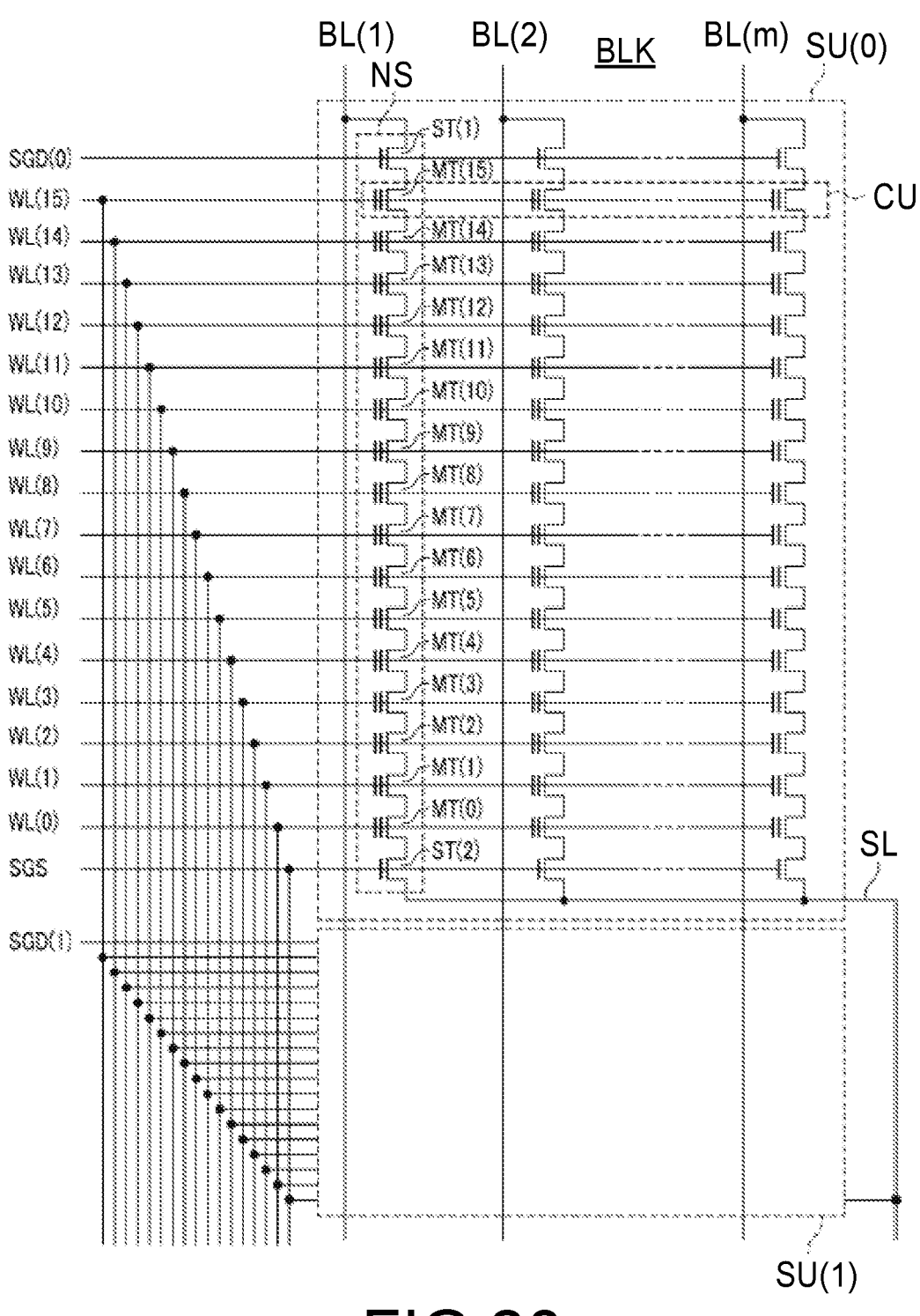
FIG. 20 is a circuit diagram illustrating an example of a circuit configuration of the memory cell array.

FIG. 20 is a circuit diagram illustrating an example of a circuit configuration of the memory cell array MCA. One block BLK is extracted from the blocks BLK included in the memory cell array MCA. As illustrated in FIG. 20, the block BLK includes a plurality of string units SU(0) to SU(k) (k is an integer of 1 or more).

Each string unit SU includes a plurality of NAND strings NS respectively associated with bit lines BL(0) to BL(m) (m is an integer of 1 or more). Each NAND string NS includes, for example, memory cell transistors MT(0) to MT(15) and selection transistors ST(1) and ST(2). The memory cell transistor MT includes a control gate and a charge storage layer and retains data in a non-volatile manner. Each of the selection transistors ST(1) and ST(2) is used for selecting the string units SU in various operations.

In each NAND string NS, the memory cell transistors MT(0) to MT(15) are connected in series. A drain of the selection transistor ST(1) is connected to an associated bit line BL, and a source of the selection transistor ST(1) is connected to one end of the memory cell transistors MT(0) to MT(15) connected in series. A drain of the selection transistor ST(2) is connected to the other end of the memory cell transistors MT(0) to MT(15) connected in series. A source of the selection transistor ST(2) is connected to a source line SL.

In one block BLK, the control gates of the memory cell transistors MT(0) to MT(15) are connected in common to the word lines WL(0) to WL(15). Gates of the selection transistors ST(1) in the string units SU(0) to SU(k) are connected to selection gate lines SGD(0) to SGD(k), respectively. Gates of the selection transistors ST(2) are connected to a selection gate line SGS in common.

In the circuit configuration of the memory cell array MCA described above, each bit line BL is shared by the NAND strings NS in the respective string units SU, to which the same column address is assigned. The source line SL is shared by, for example, the blocks BLK.

A set of the memory cell transistors MT connected to the common word line WL in one string unit SU is called, for example, a cell unit CU. For example, the storage capacity of the cell unit CU including the memory cell transistors MT each storing therein 1-bit data is defined as "1-page data". The cell unit CU can have a storage capacity of 2-page data or more in accordance with the number of bits of data stored in the memory cell transistor MT.

The memory cell array MCA included in the semiconductor storage device 100 according to any of the above embodiments is not limited to the memory cell array having the circuit configuration described above. For example, each of the number of the memory cell transistors MT and the number of the selection transistors ST(1) and ST(2) included in each NAND string NS can be designed to be any number. The number of the string units SU included in each block BLK can be designed to be any number.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor storage device comprising:
   a first stack having a first insulation film and a first conductive film alternately stacked in a first direction;
   a plurality of first column portions respectively including a first semiconductor portion extending in the first stack in the first direction and a charge trapping film provided on an outer circumferential surface of the first semiconductor portion;
   a first isolation portion penetrating through an upper-layer portion of the first stack in the first direction, extending in a second direction that crosses the first direction, including a second insulation film and a third insulation film arranged via the second insulation film, and configured to electrically isolate the first conductive film included in the upper-layer portion of the first stack in a third direction that crosses the first and second directions;
   a second insulation portion provided at a side of the third direction of the first isolation portion, extending in the first and the second directions, including a fourth insulating film, and penetrating through the first stack in the first direction, a bottom end of the second insulation portion being below a bottom end of the first isolation portion; and a third insulation portion provided at the opposite side of the third direction of the first isolation portion, extending in the first and the second directions, including a fifth insulating film, and penetrating through the first stack in the first direction, a bottom end of the third insulation portion being below a bottom end of the first isolation portion, wherein a bottom surface of the third insulating film is below the first conductive film located at a top of a topmost position among the first conductive films within the first stack, and a lowest part of the second insulation film is in direct contact with a lowest part of the third insulation film.

2. The device of claim 1, wherein the second insulation film covers the upper-layer portion of the first stack and isolates the upper-layer portion and the third insulation film from each other.

3. The device of claim 1, wherein the first isolation portion electrically isolates the first conductive film in the upper-layer portion of the first stack.

4. The device of claim 1, wherein a first protection film is provided between the first conductive film and the first insulation film, and the first protection film is not provided between the first conductive film and the second insulation film.

5. The device of claim 1, wherein the second insulation film is provided between the first conductive film and the third insulation film, and the first conductive film is in direct contact with the second insulation film.

6. The device of claim 1, wherein the first isolation portion further includes a sixth insulation film provided inside the third insulation film.

7. The device of claim 6, wherein the first isolation portion further includes a seventh insulation film provided inside the fourth insulation film.

8. The device of claim 1, wherein a void is present in the third insulation film.

9. The device of claim 6, wherein a void is present in the sixth insulation film.

10. The device of claim 7, wherein a void is present in the seventh insulation film.

11. The device of claim 1, wherein the second insulation film contains any of a silicon nitride film (SiN), aluminum oxide ($Al_2O_3$), aluminum nitride (AlN), and zirconium oxide ($ZrO_2$).

12. The device of claim 1, wherein the third insulation film contains a silicon oxide film (SiO).

13. The device of claim 6, wherein the sixth insulation film contains a silicon nitride film (SiN).

14. The device of claim 7, wherein the seventh insulation film contains a silicon oxide film (SiO).

15. The device of claim 1, wherein the first conductive film includes at least one drain-side selection gate line, and the third insulating film penetrates the at least one drain-side selection gate line.

16. The device of claim 1, wherein the first conductive film includes at least one word line and a source-side selection gate line provided below the at least one word line, and the bottom surface of the first isolation portion is above the at least one word line.

17. A semiconductor storage device comprising:

a first stack having a first insulation film and a first conductive film alternately stacked in a first direction;

a plurality of first column portions respectively including a first semiconductor portion extending in the first stack in the first direction and a charge trapping film provided on an outer circumferential surface of the first semiconductor portion;

a first isolation portion penetrating through an upper-layer portion of the first stack in the first direction, extending in a second direction that crosses the first direction, including a second insulation film and a third insulation film arranged via the second insulation film, and configured to electrically isolate the first conductive film included in the upper-layer portion of the first stack in a third direction that crosses the first and second directions;

a second insulation portion provided at a side of the third direction of the first isolation portion, extending in the first and the second directions, including a fourth insulating film, and penetrating through the first stack in the first direction, a bottom end of the second insulation portion being below a bottom end of the first isolation portion; and a third insulation portion provided at the opposite side of the third direction of the first isolation portion, extending in the first and the second directions, including a fifth insulating film, and penetrating through the first stack in the first direction, a bottom end of the third insulation portion being below a bottom end of the first isolation portion, wherein an uppermost part of the second insulation film and an uppermost part of the third insulation film are flush with each other.

18. The device of claim 17, wherein the second insulation film covers the upper-layer portion of the first stack and isolates the upper-layer portion and the third insulation film from each other.

19. The device of claim 17, wherein the first isolation portion electrically isolates the first conductive film in the upper-layer portion of the first stack.

20. The device of claim 17, wherein a first protection film is provided between the first conductive film and the first insulation film, and the first protection film is not provided between the first conductive film and the second insulation film.

21. The device of claim 17, wherein the second insulation film is provided between the first conductive film and the third insulation film, and the first conductive film is in direct contact with the second insulation film.

22. The device of claim 17, wherein the first isolation portion further includes a sixth insulation film provided inside the third insulation film.

* * * * *